US011295998B2

(12) United States Patent
Christianson et al.

(10) Patent No.: US 11,295,998 B2
(45) Date of Patent: Apr. 5, 2022

(54) STIFFENER AND PACKAGE SUBSTRATE FOR A SEMICONDUCTOR PACKAGE

(71) Applicant: Intel Corporation, Santa Clara, CA (US)

(72) Inventors: Stephen Christianson, Tigard, OR (US); Stephen Hall, Forest Grove, OR (US); Emile Davies-Venn, Gilbert, AZ (US); Dong-Ho Han, Beaverton, OR (US); Kemal Aygun, Tempe, AZ (US); Konika Ganguly, Portland, OR (US); Jun Liao, Hillsboro, OR (US); M. Reza Zamani, Hillsboro, OR (US); Cory Mason, Hillsboro, OR (US); Kirankumar Kamisetty, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 853 days.

(21) Appl. No.: 15/945,641

(22) Filed: Apr. 4, 2018

(65) Prior Publication Data
US 2019/0311963 A1 Oct. 10, 2019

(51) Int. Cl.
*H01L 23/16* (2006.01)
*H01L 23/66* (2006.01)
(Continued)

(52) U.S. Cl.
CPC .......... *H01L 23/16* (2013.01); *H01L 21/4846* (2013.01); *H01L 23/562* (2013.01);
(Continued)

(58) Field of Classification Search
CPC ....... H01L 23/16; H01L 23/66; H01L 23/562; H01L 24/16; H01L 21/4846;
(Continued)

(56) References Cited

U.S. PATENT DOCUMENTS

2014/0048951 A1* 2/2014 Lin ................... H01L 23/49833
257/774
2016/0095209 A1* 3/2016 Starkston .............. H01L 23/562
361/767
(Continued)

*Primary Examiner* — Karen Kusumakar
*Assistant Examiner* — Adam S Bowen
(74) *Attorney, Agent, or Firm* — Schwabe, Williamson & Wyatt P.C.

(57) ABSTRACT

Techniques for fabricating a package substrate and/or a stiffener for a semiconductor package are described. For one technique, a package substrate comprises: a routing layer comprising a dielectric layer. A stiffener may be above the routing layer and a conductive line may be on the routing layer, the conductive line comprising first and second portions, the first portion having a first width, the second portion having a second width, the conductive line extending from a first region of the routing layer to a second region of the routing layer, the first region being under the stiffener, the second region being outside the stiffener, the first portion being on the first region, and the second portion being on the second region. One or more portions of the conductive line can be perpendicular to an edge of the stiffener. The perpendicular portion(s) may comprise a transition between the first and second widths.

29 Claims, 7 Drawing Sheets

(51) Int. Cl.
  *H01L 23/00*   (2006.01)
  *H01P 3/08*    (2006.01)
  *H01L 21/48*   (2006.01)
  *H01P 11/00*   (2006.01)

(52) U.S. Cl.
  CPC .............. *H01L 23/66* (2013.01); *H01L 24/16* (2013.01); *H01P 3/081* (2013.01); *H01P 11/003* (2013.01); *H01L 2223/6627* (2013.01); *H01L 2224/16225* (2013.01); *H01L 2924/19032* (2013.01); *H01L 2924/3511* (2013.01); *H01L 2924/35121* (2013.01)

(58) Field of Classification Search
  CPC ... H01L 2924/35121; H01L 2223/6627; H01L 2224/16225; H01L 2924/19032; H01L 2924/3511; H01L 23/552; H01L 23/49838; H01L 24/13; H01L 24/48; H01L 2224/48227; H01L 2224/16227; H01L 2224/131; H01P 3/081; H01P 11/003; H01P 5/028
  See application file for complete search history.

(56)        References Cited

U.S. PATENT DOCUMENTS

2016/0268213 A1\*  9/2016  Jiang ........................ H01L 24/32
2016/0366762 A1\*  12/2016  Lin ........................ H01L 25/065

\* cited by examiner

STIFFENER AND PACKAGE SUBSTRATE FOR A SEMICONDUCTOR PACKAGE

BACKGROUND

Field

Embodiments described herein relate to semiconductor packages. More specifically, described embodiments are directed to a package substrate having a stiffener thereon, a semiconductor package comprising a package substrate having a stiffener thereon, and techniques of forming such package substrates, stiffeners, and semiconductor packages.

Background Information

A semiconductor package may comprise a package substrate, one or more semiconductor dies (which may also be referred to as integrated circuits (ICs) herein) on the package substrate, and a stiffener above the package substrate. In this semiconductor package, the stiffener can be used to prevent warpage and/or delamination that may affect the semiconductor package (e.g., the package substrate, one or more of the dies, etc.).

A stiffener can be fabricated from one or more materials that are electrically conductive and/or magnetically inductive (e.g., a metallic material, a combination of metallic materials, etc.). When this type of stiffener is used in a semiconductor package, it may be in close proximity to one or more metal layers in a package substrate, such as a routing layer comprising one or more conductive lines (conductive lines may also be referred to herein as traces). Owning, at least in part, to this close proximity, the stiffener can negatively affect the semiconductor package's achievable performance characteristics (e.g., memory performance, electrical performance, etc.). For example, the stiffener may assist with causing signal quality issues for the semiconductor package (e.g., crosstalk, insertion loss, impedance mismatch, etc.). One technique of reducing the negative effect(s) caused by the stiffener in the semiconductor package is to shield the stiffener from the semiconductor package's signal routes (e.g., a routing layer formed in or on a package substrate comprising one or more conductive lines, etc.) with additional semiconductor package layers (e.g., dielectric layers, etc.). These additional layers can increase a semiconductor package's thickness (e.g., z-height, etc.), which can in turn create challenges to miniaturizing a semiconductor package's thickness.

BRIEF DESCRIPTION OF THE DRAWINGS

Embodiments described herein are illustrated by way of example and not limitation in the figures of the accompanying drawings, in which like references indicate similar features. Furthermore, in the figures, some conventional details have been omitted so as not to obscure from the inventive concepts described herein.

DETAILED DESCRIPTION

Figure 1A:
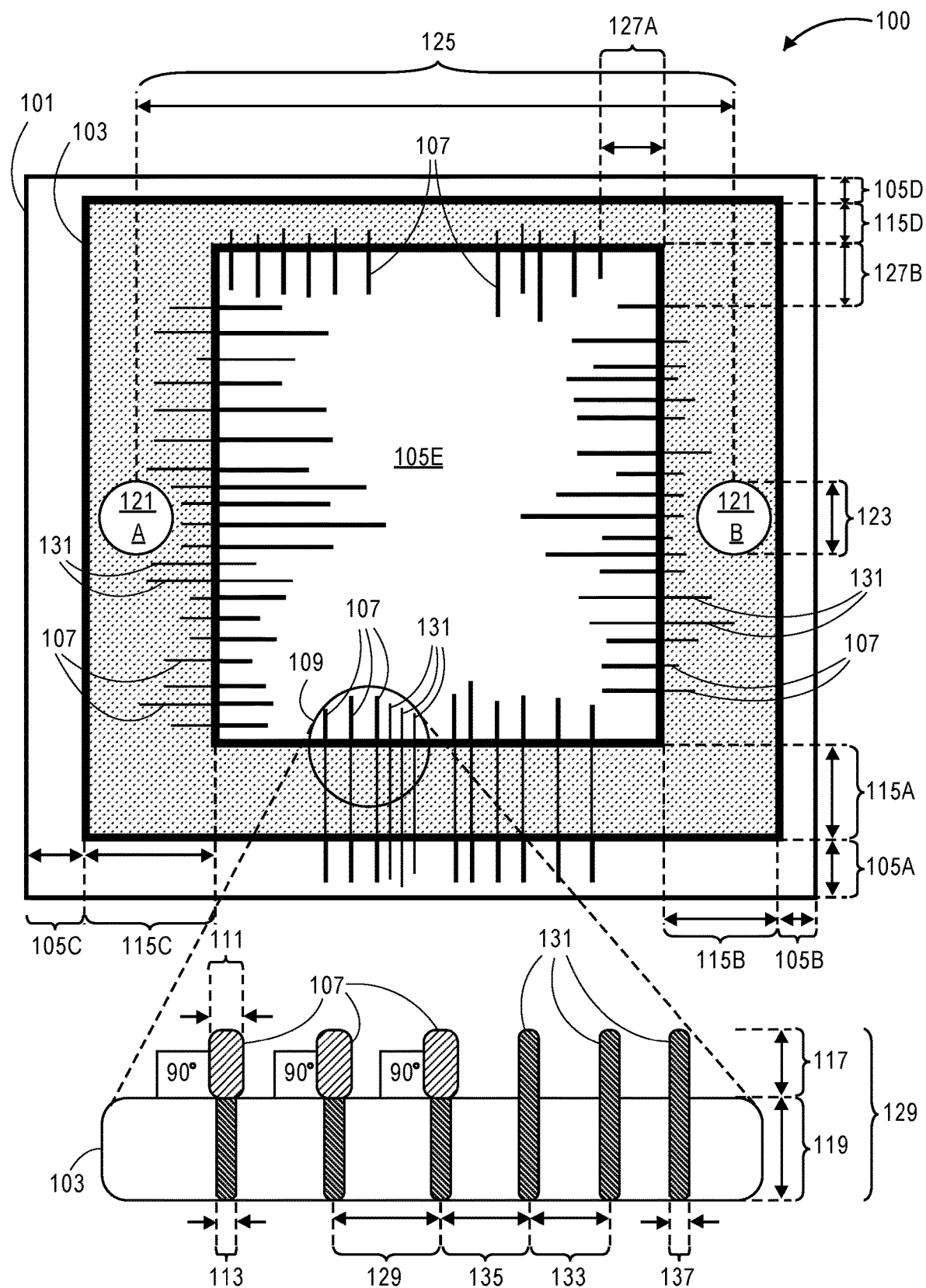
FIG. 1A is a plan view illustration of a package substrate for a semiconductor package where the package substrate has conductive lines formed thereon and a stiffener is on the package substrate, according to one embodiment.

Embodiments described herein provide techniques that can assist with fabricating a package substrate for a semiconductor package, where a stiffener is on or above the package substrate and where the package substrate includes one or more layers (e.g, a metal layer, a dielectric layer, etc.). Several advantages are provided by the embodiments described herein. One advantage is that the embodiment(s) described herein can assist with mitigating one or more negative effects caused by a stiffener above a package substrate. Examples of the negative effect(s) include, but are not limited to, negative electrical effects (e.g., crosstalk, insertion loss, impedance mismatch, etc.). Mitigation of the negative effect(s) can assist with reducing costs associated with the fabrication of package substrates and semiconductor packages. Mitigation of the negative effect(s) can also assist with reducing a need for investment in specialized equipment required to perform complicated and/or costly techniques of minimizing the negative effect(s). Another advantage is that the embodiment(s) described herein can assist with improving performance characteristics of semiconductor packages utilizing stiffeners by improving the semiconductor package's memory performance. Yet another advantage is that the embodiment(s) described herein can assist with reducing the need for one or more additional layers in a package substrate used to shield stiffeners, which can in turn reduce thicknesses (e.g., z-heights, etc.) and/or costs associated with semiconductor manufacturing and/or packaging, with increasing the achievable input/output (I/O or IO) density per millimeter per layer (IO/mm/layer) associated with semiconductor manufacturing and/or packaging, and with enhancing one or more properties associated with semiconductor manufacturing and/or packaging (e.g., enhancing a package substrate's electrical performance, enhancing a semiconductor package's electrical performance, etc.).

For brevity, the phrase "the art", "the art of semiconductor manufacturing and/or packaging" and their variations as used herein comprise one or more of: (i) the art of semiconductor manufacturing; (ii) the art of semiconductor packaging; (iii) the field of semiconductor manufacturing; and (iv) the field of semiconductor packaging.

As used herein, the term "feature" refers to any part, element, or component known in the art that is attached to, adhered to, deposited on or over, applied to, formed in, embedded in, or formed on or over a layer of a package substrate, a die, or a board (e.g., a printed circuit board). Examples of features include, but are not limited to, stiffeners, heat spreaders, heat sinks, vias, pads, conductive lines (also referred to as traces herein), via-pad structures, interconnect structures (e.g., wires, solder bumps, any other types of bumps, conductive pillars, etc.), and discrete electronic devices (e.g., inductors, capacitors, resistors, transistors, etc.). Some features include one or more other features. For example, a via-pad structure includes one or more of a via and a pad formed in or on a layer of package substrate.

As used herein, the terms "pitch", "spacing", "distance", and their variations refer to a nominal distance between specified locations of adjacent features on or in a layer of a package substrate, a die, or a board. The nominal distance may not match any real-world dimension, but—within the domain of a layer of a package substrate, a die, or a board—the nominal size may correspond to a standardized dimension and/or tolerance. When a first feature is adjacent to a second feature, one or more third features may or may not be between the first and second features. One example of a specified location is a center location. For this example, a pitch may be referred to as a center-to-center spacing—that is, a straight line distance between centers of two adjacent features. Another example of a specified location is an edge. For this example, a pitch may be referred to as an edge-to-edge spacing—that is, a straight line distance between corresponding edges of two adjacent features.

As used herein, the term "edge", "border", and their variations refer to an outside limit of a feature on a layer of a package substrate, a die, or a board that is farthest away from a specified location. For a first example, an edge of a stiffener is farthest away from a center of the stiffener. For a second example, an edge of a stiffener is farthest away from a center of a package substrate.

For one embodiment, a trace width modulation (TWM) technique is employed for fabricating a package substrate having a stiffener thereon. The package substrate can be included as part of a semiconductor package. For one embodiment, the TWM technique is applicable to one or more electrical interfaces of package substrates employing single-ended or differential signaling techniques. For one embodiment, the TWM technique comprises trace width modulating conductive lines on a routing layer of a package substrate having a stiffener thereon. In this way, impedance matching between stiffener and non-stiffener regions on the routing layer can be improved. For one embodiment, the TWM technique comprises a method of fabricating a package substrate for a semiconductor package, the method comprising: fabricating a routing layer as part of the package substrate; fabricating a conductive line on the routing layer; and placing a stiffener above the routing layer, the stiffener comprising an opening, wherein a first portion of the conductive line under the stiffener has a first width and a second portion of the conductive line outside the stiffener has a second width. The first and second widths may be equal to or different from each other. For one embodiment, the first width is smaller than the second width. For one embodiment of the method, fabricating the conductive line on the routing layer comprises fabricating one or more of the first and second portions of the conductive line to be perpendicular to an edge of the stiffener on the conductive line. For one embodiment of the method, a portion of the conductive line on the routing layer that is perpendicular to an edge of the stiffener comprises a portion of the conductive line where the first portion of the conductive line and the second portion of the conductive line transition into each other.

FIG. 1A illustrates a plan view of a package substrate 100. The package substrate can be used to form a semiconductor memory. Examples of semiconductor memory include, but are not limited to, volatile memory and nonvolatile memory. Examples of volatile memory include, but are not limited to, dynamic random access memory (DRAM) and static random access memory (SRAM). Examples of nonvolatile memory include, but are not limited to, electrically addressed systems (e.g., read only memory (ROM), etc.) and mechanically addressed systems (e.g., hard disks, optical disc, magnetic tape, holographic memory, etc.). The package substrate 100 shown in FIG. 1A omits one or more components and/or structures known in the art for simplicity and to avoid obscuring and/or convoluting one or more of the inventive concepts described herein. Furthermore, the package substrate 100 can be included in a semiconductor package. The package substrate 100 can also be included in packaged system (e.g., a packaged system 200 described below in connection with FIG. 2A, a packaged system 297 described below in connection with FIG. 2B, a packaged system 299 described below in connection with FIG. 2C, etc.).

The package substrate 100 comprises one or more layers, Examples of layers include, but are not limited to, one or more layers formed from a metallic material or a combination of metallic materials, and one or more layers formed from a dielectric material or a combination of dielectric materials. For brevity, a layer formed from a metallic material or a combination of metallic materials is referred to as a metal layer herein and a layer formed from a dielectric material or a combination of dielectric materials is referred to as a dielectric layer herein. Examples of dielectric layers include, but are not limited to, an interlayer dielectric, a trench insulation layer, any other insulating layer known in the art, or any combination thereof.

For one embodiment, the package substrate 100 includes a routing layer 101. As used herein, a "routing layer" and its variations includes, but is not limited to, one or more layers of a package substrate on or in which conductive lines are formed. For a first example, a routing layer may comprise one or more of layers of a package substrate formed from at least one conductive pattern, and configured to enable coupling of two or more features on or in the package substrate. For a second example, a routing layer may comprise a plurality of layers of a package substrate formed from at least one conductive pattern and at least one insulating layer, and configured to enable coupling of two or more features on or in the package substrate. Examples of coupling include, but are not limited to, electrical coupling, magnetic coupling, optical coupling, or a combination thereof. For one embodiment, the routing layer 101 comprises one or more of: (i) one or more metal layers; and (ii) one or more dielectric layers. For one embodiment, the routing layer 101 comprises one or more metallic layers, where each of the one or more metallic layers is sandwiched between two or more dielectric layers and where at least one of the one or more dielectric and/or metal layers has one or more conductive lines 107 formed therein or thereon. For one embodiment, the routing layer 101 comprises one or more dielectric layers, where at least one of the one or more dielectric layers has one or more conductive lines 107 formed therein or thereon.

Examples of conductive lines include, but are not limited to, microstrip conductive lines and stripline conductive lines. Examples of microstrip conductive lines include, but are not limited to, regular microstrip conductive lines, edge-coupled microstrip conductive lines, and embedded microstrip conductive lines. Regular microstrip conductive lines are conductive lines that are routed on an external layer of a routing layer. Forming these types of microstrip conductive lines requires designing of a thickness and a width of a conductive line, a height of the package substrate, and a type of dielectric material used to form one or more layers of the routing layer. Edge-coupled microstrip conductive lines enable routing differential pairs. Forming these types of microstrip conductive lines includes the same requirements as those used to form regular microstrip conductive lines with an additional requirement to design a conductive line spacing for a differential pair. Embedded microstrip conductive lines are also similar to regular microstrip conductive lines except that there is another dielectric layer above the microstrip conductive lines. Stripline conductive lines are surrounded by dielectric material suspended between two ground planes on internal layers of a routing layer. Examples of stripline conductive lines include, but are not limited to, symmetric or regular stripline conductive lines, asymmetric stripline conductive lines, edge-coupled stripline conductive lines, and broadside-coupled stripline. Symmetric or regular stripline conductive lines are routed on internal layers (between two ground planes) of a routing layer. Forming these types of stripline conductive lines requires designing of a thickness and a width of a conductive line, a height of the package substrate, and a type of dielectric material used to form one or more layers of the routing layer based on a constraint that requires the conductive lines to be embedded between the two ground planes. Forming these types of stripline conductive lines includes the same requirements as those used to form symmetric stripline conductive lines with an additional requirement to account for any stripline conductive lines that are not balanced precisely between the two ground planes. Edge-Coupled stripline conductive lines are for routing internal layer differential pairs. Forming these types of stripline conductive lines includes the same requirements as those used to form symmetric stripline conductive lines with an additional requirement to design a conductive line spacing for the differential pair. Broadside-Coupled stripline conductive lines are for routing internal layer differential pairs, but instead of side by side, the pairs are stacked on top of each other. Forming these types of stripline conductive lines includes the same requirements as those used to form edge-coupled stripline conductive lines.

Metallic materials, as used herein, may be formed from any suitable material that is electrically conductive and/or magnetically inductive. Metallic materials include, but are not limited to, copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), silver (Au), platinum (Pt), or any combination thereof. Dielectric materials may be formed from any suitable material that is electrically insulative. Dielectric materials include, but are not limited to, Ajinomoto Build-up Film (ABF), liquid crystal polymer, benzocyclobutene (BCB), polyimide, prepreg (a weaved fiber network "pre-impregnated" into an epoxy matrix), epoxy, epoxy laminate material (e.g., FR4, G10, G11, FR4, FR5, FR6, etc.), or any combination thereof.

For one embodiment, a stiffener 103 is on or above the routing layer 101. The stiffener may be formed from any suitable material that is electrically conductive and/or magnetically inductive (e.g., a metallic material, a combination of metallic materials, etc.). For one or more embodiments, an adhesive material (e.g., a film, a paste, a liquid, etc.) may be deposited on, applied to, attached to, or adhered to a top surface of the routing layer 101 for securing the stiffener 103 on or above the routing layer 101. The adhesive material may be patterned, in one example, to match a shape of a stiffener 103. For one or more embodiments, an adhesive material is not required to secure the stiffener 103 on the routing layer 101.

As shown in FIG. 1A, the stiffener 103 covers (e.g., is above, is on, etc.) some, but not all, portions of the routing layer 101. For example, the stiffener 103 covers the regions 115A-D, while the stiffener 103 does not cover the regions 105A-E of the routing layer 101. For brevity, any area of the routing layer 101 under the stiffener (i.e., is covered by or is under the stiffener 103) is referred to herein as a stiffener region and any area of the routing layer 101 outside the stiffener (i.e., is not covered by or is not under the stiffener 103) is referred to herein as a non-stiffener region. For one embodiment, the routing layer 101 having the stiffener 103 thereon includes multiple stiffener and non-stiffener regions. For example, and as shown in FIG. 1A, the routing layer 101 having the stiffener 103 thereon includes five non-stiffener regions 105A-E and four stiffener regions 115A-D. The five non-stiffener regions include: a first non-stiffener region 105A; a second non-stiffener region 105B; a third non-stiffener region 105C; a fourth non-stiffener region 105D; and a fifth non-stiffener region 105E. The four stiffener regions include: a first stiffener region 115A; a second stiffener region 115B; a third stiffener region 115C; and a fourth stiffener region 115D.

For one embodiment, the routing layer 101 may include via-pad structures 121A-B. As used herein, a "via-pad structure" and its variations refers to a pad and/or a via on the pad, where the pad and/or the via on the pad are formed in or on a layer of package substrate. For example, the via-pad structures 121A-B are formed in or on the routing layer 101.

The via-pad structures 121A-B are designed to provide electrical grounding connections for the stiffener 103 and/or other features on the routing layer 101. That is, one or more of the via-pad structures 121A-B acts as an electrical ground (VSS) for the stiffener 103 and/or other features on the routing layer 101. The via-pad structures 121A-B on the routing layer 101 may be coated with a suitable metallic material or combination of suitable metallic materials. The stiffener 103 may have a number of holes that may be positioned to correspond to (e.g., collocated with) the via-pad structures 121A-B on the routing layer 101 and/or the holes of the adhesive material described above. For one embodiment, the via-pad structures 121A-B on the routing layer 101 are generally accessible through the holes of the stiffener 103 and/or the holes of the adhesive material. For one embodiment, the stiffener 103 is coupled to the via-pad structures 121A-B via the holes of the stiffener and/or the holes of the adhesive material using an electrically conductive mechanism (e.g., solder, conductive epoxy, wire bonds, any other suitable electrically conductive mechanism known in the art, any combination thereof, etc.). The via-pad structures 121A-B, the holes of the stiffener 103, and/or holes of the adhesive material may be circular. However, any other shape may be implemented to meet design criteria of a particular implementation (e.g., a square shape, any combination of shapes, etc.). Furthermore, each of the via-pad structures 121A-B, each hole of the stiffener 103, and/or each hole of the adhesive material may have a different shape from other via-pad structures 121A-B, holes of the stiffener 103, and/or holes of the adhesive material. Although only two via-pad structures 121A-B are shown in FIG. 1A, any number of via-pad structures 121A-B may be used to secure the stiffener 103 to the routing layer 101.

For one embodiment, the stiffener 103 lacks holes and is coupled to the via-pad structures 121A-B using an electrically conductive mechanism (e.g., solder, conductive epoxy, wire bonds, any other suitable electrically conductive mechanism known in the art, any combination thereof, etc.). For one embodiment, the stiffener 103 is coupled to at least one of the via-pad structures 121A-B that acts as an electrical ground (VSS) for the stiffener 103 using a conductive epoxy material and one or more design rules (e.g., spacing, etc.). One advantage of this embodiment is that the coupling and design rule(s) can assist with minimizing an imbalance in an induced charge between reference planes and other resonant radiation. As explained above, the stiffener 103 may have zero or more holes positioned to correspond to via-pad structures 121A-B of the routing layer 101. For one embodiment, one or more of the via-pad structures 121A-B has a specified diameter 123. For example, at least one of the via-pad structures 121A-B has a diameter 123 that is less than or equal to 220 micrometers (μm). For one embodiment, a pitch 125 between two via-pad structures 121A-B is specified. For example, the pitch 125 is less than, approximately equal to, or equal to 19800 μm. The pitch 125 may be measured from a first point on the via-pad structure 121A to a corresponding second point on the via-pad structure 121B. For example, the pitch 125 is measured as a center-to-center spacing between the via-pad structures 121A-B—that is, from a center point on the via-pad structure 121A to a corresponding center point on the via-pad structure 121B.

For one embodiment, a length of the stiffener 103 may be specified. For a further embodiment, one or more of the via-pad structures 121A-B are positioned on the routing layer 101 at half the length of the stiffener 103. For example, a length of the stiffener 103, which is measured as a pitch from the outermost edge of region 115A to the outermost edge of region 115D, is less than, approximately equal to, or equal to 8000 μm. For this example, one or more of the via-pad structures 121A-B are positioned on the routing layer 101 at half the length of the stiffener 103—that is, 4000 μm (when measured as a pitch from the outermost edge of region 115A to one of the via-pad structures 121A-B or a pitch from the outermost edge of region 115D to one of the via-pad structures 121A-B).

For one embodiment, a clearing area may exist on the routing layer 101 between one or more of the via-pad structures 121A-B and a corresponding edge of the stiffener 103. For one embodiment, the corresponding edge of the stiffener 103 is the edge closest to the via-pad structure 121A or the via-pad structure 121B. For a first example, and as shown in FIG. 1A, a clearing area between the via-pad structure 121A and the outermost edge of the region 115C can be measured as a pitch that is less than, approximately equal to, or equal to 310 μm. For a second example, and as shown in FIG. 1A, a clearing area between the via-pad structure 121B and the outermost edge of the region 115B can be measured as a pitch that is less than, approximately equal to, or equal to 310 μm.

For one embodiment, the routing layer 101 has one or more conductive lines 107 and one or more conductive lines 131 formed thereon. One or more of the conductive lines 107 and the conductive lines 131 can be formed from any suitable material that is electrically conductive and/or magnetically inductive (e.g., a metallic material, a combination of metallic materials, etc.). For one embodiment, the conductive lines 107 carry a first type of signal or signals and the conductive lines 131 carry a second type of signal or signals, where the first and second types of signals are different from each other. One or more of the first and second types of signals may comprise clock, read, write, control, command, addressing signals, any other types of signal capable of transmitting data known in the art, or any combination of signals capable of transmitting data known in the art. For example, one or more of the first and second types of signals is used in double data rate (DDR) memory for synchronous transfers when data is read from the DDR memory. For this example, one or more of the first and second types of signals is a data strobe signal (DQS) or a data (DQ) signal as is known in the art. For brevity, the first type of signal(s) carried by the conductive lines 107 is referred to herein as a DQ signal and the second type of signal(s) carried by the conductive lines 131 is referred to herein as a DQS signal. Furthermore, a signal (e.g., a DQ signal, a DQS signal, etc.) may include a byte selected from a group consisting of two or more bytes, where two or more bytes in the group are different from each other. For example, a signal (e.g., a DQ signal, a DQS signal, etc.) may include first type of byte ("Byte1") or a second type of byte ("Byte2"). More details about the conductive lines 107 and the conductive lines 131 are provided below.

For one embodiment, and with regard to enlarged portion 109, a size (e.g., width, etc.) of a conductive line 107 is modulated to comprise two portions: (i) a first portion 117 outside the stiffener 103 (e.g., one of the five non-stiffener regions 105A-E, etc.); and (ii) a second portion 119 under the stiffener 103 (e.g., one of the four stiffener regions 115A-D, etc.). For one embodiment, the first portion 117 has a first width 111 that may or may not differ from a second width 113 of the second portion 119. The first width 111 may be a width of the first portion 117 and the second width 113 may be a width of the second portion 119. For one embodiment, the widths 111 and 113 are achieved by modulating a width of a conductive line 107, which can assist with improving impedance matching between stiffener regions 115A-D and non-stiffener regions 105A-E. This improved impedance matching can assist with achieving a desired impedance, with reducing reflection of signals propagated via the conductive lines 107, and with maximizing power transfer. For one embodiment, modulating the first width 111 of the first portion 117 and the second width 113 of the second portion 119 of a conductive line 107 can assist with achieving a desired impedance, which can vary depending on performance requirements. For one embodiment, modulating a conductive line 107 results in the first portion 117 having a first width 111 that is greater than, less than, or equal to a second width 113 of the second portion 119. For a more specific embodiment, modulating a conductive line 107 results in the first portion 117 having a first width 111 that is larger than or equal to a second width 113 of the second portion 119. For example, a conductive line 107 may be designed to have an impedance that is approximately equal or equal to 40 ohms (Ω). For this example, a ratio of the first width 111 to the second width 113 is 17:9—that is, a ratio of the second width 113 to the first width 111 is 9:17. Based on this ratio, a conductive line 107 may be modulated until the first width 111 is greater than or equal to 34 μm and the second width 113 is less than or equal to 18 μm. In this way, the conductive lines 107 having an impedance that is approximately equal or equal to 40 ohms (Ω) can be designed, achieved, and/or formed on the routing layer 101.

For one embodiment, a pitch 129 between two adjacent conductive lines 107 (without any other conductive lines between the two adjacent conductive lines 107) is a function of a difference between the first width 111 and the second width 113. For example, the pitch 129 is less than, approximately equal to, or equal to a difference between: (i) 70 μm; and (ii) a difference between the first width 111 and the second width 113. For one embodiment, a pitch 129 between two adjacent conductive lines 107 is a function of the first width 111. For example, the pitch 129 is less than, approximately equal to, or equal to a difference between: (i) 70 μm; and (ii) the first width 111. For one embodiment, a pitch 129 between two adjacent conductive lines 107 is a function of the second width 113. For example, the pitch 129 is less than, approximately equal to, or equal to a difference between: (i) 70 μm; and (ii) the second width 113. For one embodiment, the pitch 129 is a value selected from a range of values. For one example, the pitch 129 is in a range of 18-80 μm. For one example, the pitch 129 is less than, approximately equal to, or equal to 80 μm. For another example, the pitch 129 is less than, approximately equal to, or equal to 18 μm. For yet another example, the pitch 129 is less than, approximately equal to, or equal to 50 μm.

For one embodiment, two adjacent conductive lines 107 may carry DQ signals with the same byte type. For a first example, a first one of two adjacent conductive lines 107 is carrying a first DQ signal having Byte1 and a second one of the two adjacent conductive lines 107 is carrying a second DQ signal having Byte1. For a second example, a first one of two adjacent conductive lines 107 is carrying a first DQ signal having Byte2 and a second one of the two adjacent conductive lines 107 is carrying a second DQ signal having Byte2. For one embodiment where two adjacent conductive lines 107 are carrying DQ signals with the same byte type, a pitch 129 between two adjacent conductive lines 107 is a function of a difference between the first width 111 and the second width 113. For example, the pitch 129 is less than, approximately equal to, or equal to a difference between: (i) 70 μm; and (ii) a difference between the first width 111 and the second width 113. For one embodiment where two adjacent conductive lines 107 are carrying DQ signals with the same byte type, a pitch 129 between two adjacent conductive lines 107 is a function of the first width 111. For example, the pitch 129 is less than, approximately equal to, or equal to a difference between: (i) 70 μm; and (ii) the first width 111. For one embodiment where two adjacent conductive lines 107 are carrying DQ signals with the same byte type, a pitch 129 between two adjacent conductive lines 107 is a function of the second width 113. For example, the pitch 129 is less than, approximately equal to, or equal to a difference between: (i) 70 μm; and (ii) the second width 113. For one embodiment where two adjacent conductive lines 107 are carrying DQ signals with the same byte type, the pitch 129 is a value selected from a range of values. For one example, the pitch 129 is in a range of 18-80 μm. For one example, the pitch 129 is less than, approximately equal to, or equal to 80 μm. For another example, the pitch 129 is less than, approximately equal to, or equal to 18 μm. For yet another example, the pitch 129 is less than, approximately equal to, or equal to 50 μm.

For one embodiment, two adjacent conductive lines 107 may carry DQ signals with differing byte types. For a first example, a first one of two adjacent conductive lines 107 is carrying a first DQ signal having Byte1 and a second one of the two adjacent conductive lines 107 is carrying a second DQ signal having Byte2. For a second example, a first one of two adjacent conductive lines 107 is carrying a first DQ signal having Byte2 and a second one of the two adjacent conductive lines 107 is carrying a second DQ signal having Byte1. For one embodiment where two adjacent conductive lines 107 are carrying DQ signals with different byte types, the pitch 129 is less than, approximately equal to, or equal to 80 μm.

For one embodiment, and with regard to enlarged portion 109, a width (e.g., width, etc.) of a conductive line 131 is not modulated—that is, a width of the conductive line 131 remains uniform regardless of whether the conductive line 131 is outside the stiffener 103 (e.g., one of the five non-stiffener regions 105A-E, etc.) or under the stiffener 103 (e.g., one of the four stiffener regions 115A-D, etc.). For the specific embodiment shown in FIG. 1A, the conductive line 131 has a width 137. For one embodiment, the width 137 is less than, approximately equal to, or equal to the first width 111. For one embodiment, the width 137 is less than, approximately equal to, or equal to the second width 113.

For one embodiment, a pitch 133 between two adjacent conductive lines 131 (without any other conductive lines between the two adjacent conductive lines 131) is a value selected from a range of values. For one example, the pitch 133 is in a range of 18-80 μm. For one example, the pitch 133 is less than, approximately equal to, or equal to 18 μm. For another example, the pitch 133 is less than, approximately equal to, or equal to 50 μm.

For one embodiment, a pitch 135 between a conductive line 107 that is adjacent to a conductive line 131 (without any other conductive lines between the two adjacent conductive lines 107 and 131) is a value selected from a range of values. For one example, the pitch 135 is in a range of 18-80 μm. For one example, the pitch 135 is less than, approximately equal to, or equal to 18 μm. For another example, the pitch 135 is less than, approximately equal to, or equal to 50 μm.

For one embodiment, at least one portion of a conductive line 107 is perpendicular to an edge of the stiffener 103 that is on the respective conductive line 107. More specifically, at least one portion of a conductive line 107 enters one of the stiffener regions 115A-D of the stiffener 103 in an orthogonal direction (relative to edges of the stiffener 103). In this way, at least one portion of a conductive line 107 is perpendicular to an edge of one of the stiffener regions 115A-D. This perpendicular relationship can assist with preventing a time-delay mismatch between signals propagated via a conductive line 107. For one embodiment, the stiffener 103 may be designed and/or fabricated in connection with routing layer 101 to ensure that the perpendicular relationship described above is present. For one embodiment, a portion of a conductive line 107 that is perpendicular to an edge of one of the stiffener regions 115A-D includes a portion 129 where the first portion 117 and the second portion 119 transition into each other. For one embodiment, a portion of a conductive line 107 that is perpendicular to an edge of one of the stiffener regions 115A-D includes a portion 129 where the first width 111 and the second width 113 transition into each other.

For one embodiment, at least one portion of a conductive line 131 is perpendicular to an edge of the stiffener 103 that is on the respective conductive line 131. More specifically, at least one portion of a conductive line 131 enters one of the stiffener regions 115A-D of the stiffener 103 in an orthogonal direction (relative to edges of the stiffener 103). In this way, at least one portion of a conductive line 131 is perpendicular to an edge of one of the stiffener regions 115A-D. This perpendicular relationship can assist with preventing a time-delay mismatch between signals propagated via a conductive line 131. For one embodiment, the stiffener 103 may be designed and/or fabricated in connection with routing layer 101 to ensure that the perpendicular relationship described above is present.

For one embodiment, the stiffener 103 may include one or more exclusion zones 127A-B, where no conductive lines 107 and/or no conductive lines 131 are formed on the routing layer 101. That is, each exclusion zone 127A-B is an area of the stiffener 103 above the routing layer 101 used to determine where no conductive line 107 and/or no conductive line 131 is formed on the routing layer 101. For example, two exclusion zones 127A-B are shown in FIG. 1A. For this example, the zones 127A-B are used to determine locations on the routing layer 101 where no conductive lines 107 and/or no conductive lines 131 are formed. In this way, and for this example, the zones 127A-B can assist with ensuring that none of the conductive lines 107 and/or none of the conductive lines 131 entering the stiffener regions 115A-D in an orthogonal direction cross or meet. The exclusion zones 127A-B can, in one or more embodiments, be designed based on a tolerance (e.g., ±250 µm, etc.). This tolerance can assist with design rule compliance that may result from variations in semiconductor manufacturing and packaging processes (e.g., high volume manufacturing placement processes, etc.). In FIG. 1A, only two exclusion zones are shown. Other embodiments, however, are not so limited. This is because any number (e.g., 1, 2, 3, 4, etc.) of exclusion zones may be used to avoid having the conductive lines 107 entering the stiffener regions in an orthogonal direction cross or meet.

Figure 1B:
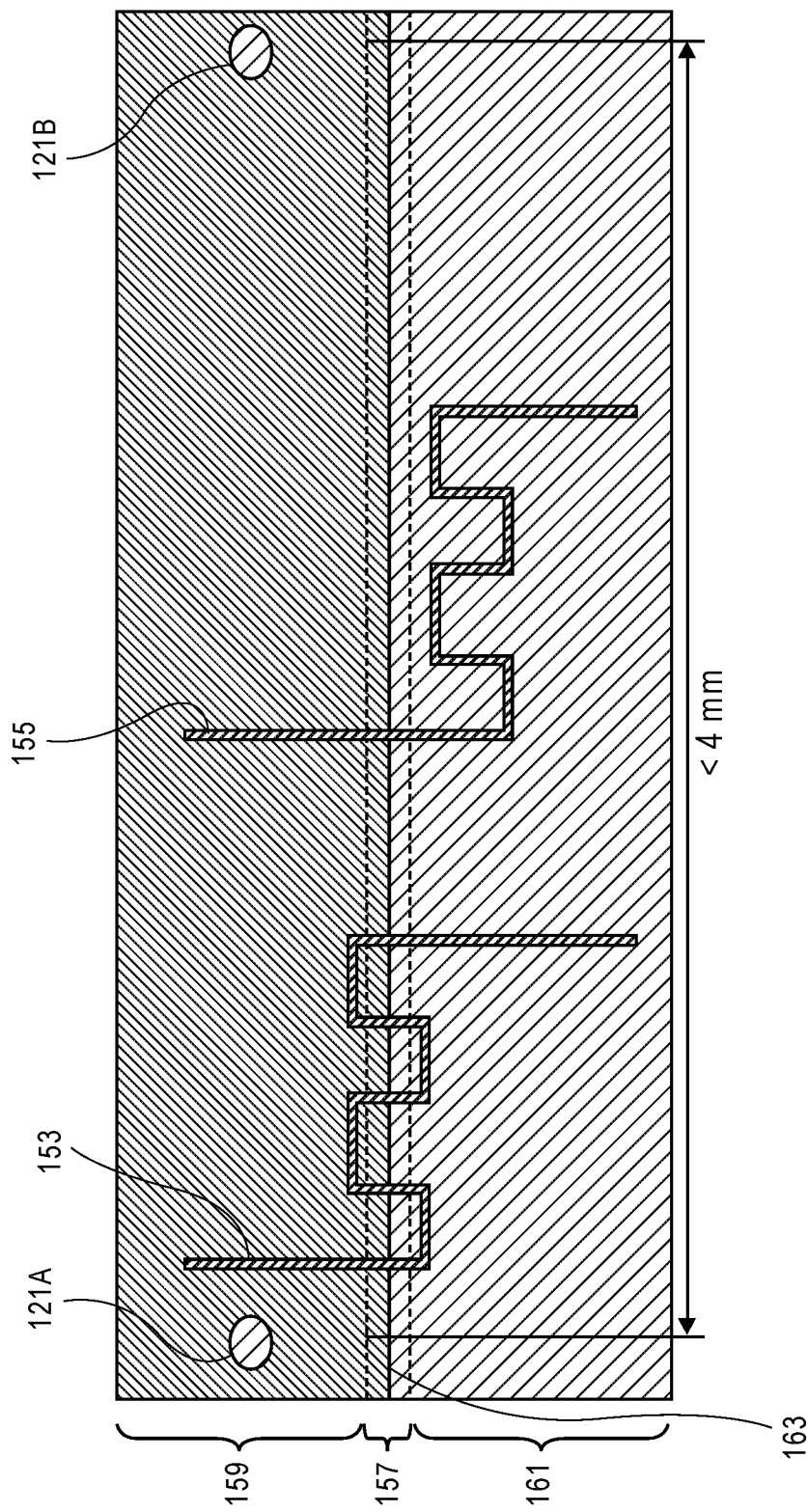
FIGS. 1B-1C are plan view illustrations of a tolerance region that allows for variations in positions of a stiffener edge without preventing a conductive line from transitioning between a stiffener region and a non-stiffener region, according to one embodiment.
Figure 1C:
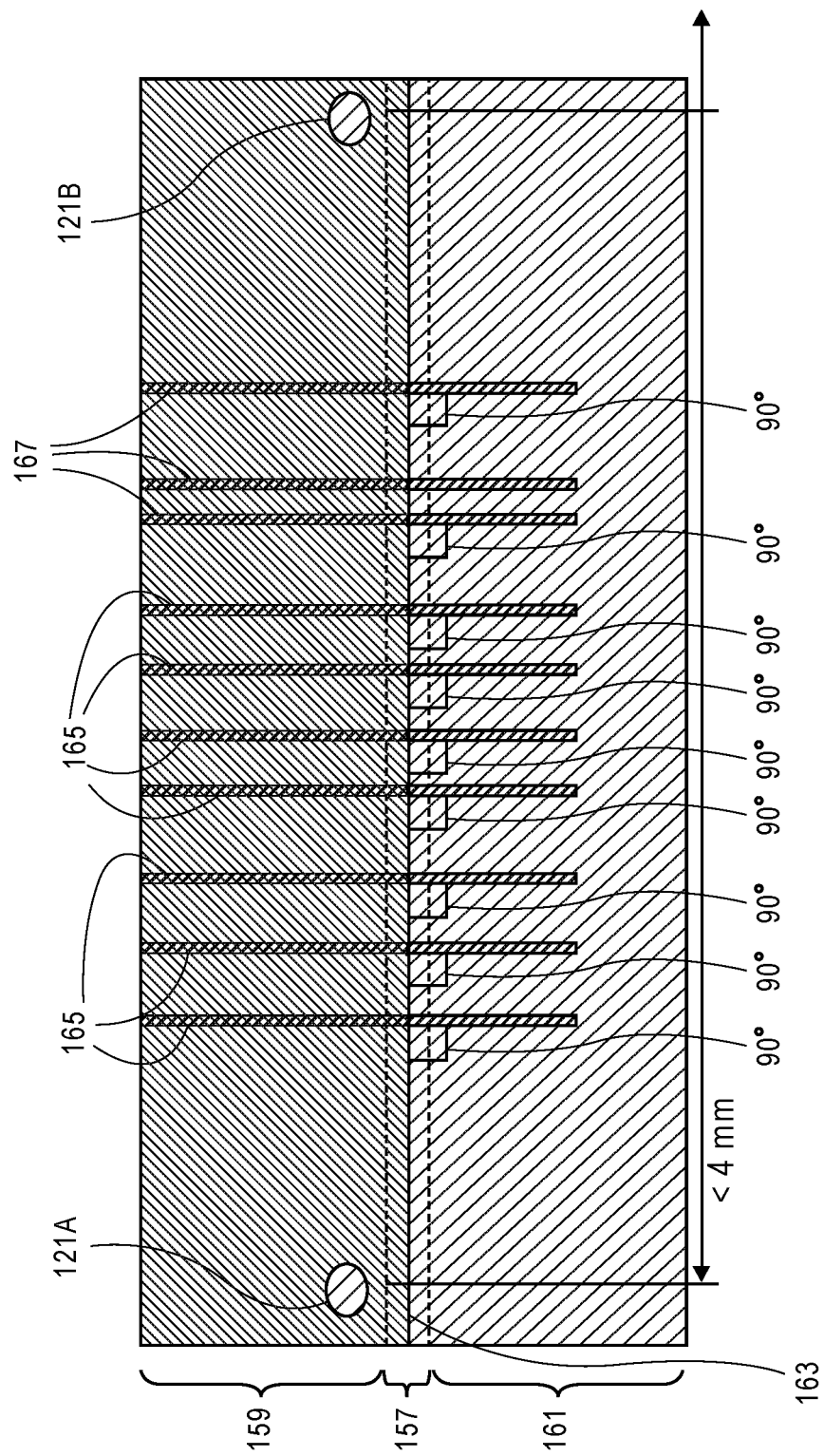

Referring briefly to FIGS. 1B-1C, which are plan view illustrations of a tolerance region 157 that allows for variations in positions of a stiffener edge 163 without preventing a conductive line 153, 155 from transitioning between a stiffener region 159 and a non-stiffener region 161, according to one embodiment. The stiffener region 159 can be similar to or the same as any of the stiffener regions described herein in connection with at least FIG. 1A. The non-stiffener region 161 can be similar to or the same as any of the non-stiffener regions described herein in connection with at least FIG. 1A. The stiffener edge 163 can be similar to or the same as any of the stiffener edges described herein in connection with at least FIG. 1A. The conductive line 153 can be similar to or the same as any of the conductive lines described herein in connection with at least FIG. 1A. The conductive line 155 can be similar to or the same as any of the conductive lines described herein in connection with at least FIG. 1A.

FIGS. 1B-1C are enlarged plan views of the routing layer 101 and the stiffener 103 on the routing layer 101. As is known in the art, variations in locations of the stiffener 103 (e.g., edges of the stiffener 103, etc.) on the routing layer 101 are possible due to variations in manufacturing and/or assembly technologies. The tolerance region 157 can assist with meeting design targets in spite of variations in the positions of the stiffener 103 (e.g., an edge of the stiffener 103, etc.) on the routing layer 101.

With specific regard now to FIG. 1B, a tolerance region 157 is between a stiffener region 159 and a non-stiffener region 161. For one embodiment, the tolerance region 157 provides an area where the edge 163 may be located. In this way, the tolerance region 157 provides an area where a conductive line (e.g., line 153, line 155, any other conductive lines described herein, etc.) can transition from a stiffener region 159 to a non-stiffener region 161 (and vice versa). For one embodiment, a conductive line 153, 155 can transition within the tolerance region 157 so long as the edge 163 is in the tolerance region 157. For one embodiment, the tolerance region 157 has a width of 250 µm.

As shown in FIG. 1B, and for one embodiment, a design rule associated with the tolerance region 157 comprises a conductive line 153, 155 transitioning within the tolerance region 157 no more than once between the stiffener region 159 and the non-stiffener region 161. For example, the design rule associated with the tolerance region 157 is violated by the conductive line 153, which transitions more than once between the stiffener region 159 and the non-stiffener region 161. In contrast, the design rule associated with the tolerance region 157 is satisfied by the conductive line 155, which transitions no more than once between the stiffener region 159 and the non-stiffener region 161. Failure to comply with this design rule can prevent conductive line 153, 155 from transitioning between the stiffener region 159 and non-stiffener region 161 at an edge 163 of the stiffener. Furthermore, this design rule allows for variations in the position of the stiffener edge 163.

Moving on to FIG. 1C, which includes many of the same components illustrated in FIG. 1B. For brevity, only differences between FIGS. 1B and 1C are described below in connection with FIG. 1C.

One difference between the FIGS. 1B and 1C is the presence of conductive lines 165 and 167. For one embodiment, the conductive lines 165 are similar to the conductive lines 107. For one embodiment, the conductive lines 167 are similar to the conductive lines 131. Another difference is that each of the conductive lines 165, 167 transitions in an orthogonal direction (relative to the edge 163 of the stiffener) within the tolerance region 157 no more than once between the stiffener region 159 and the non-stiffener region 161. For one embodiment, the single transition of the lines 155 and 157 assists with enabling the lines 155 and 157 to transition in an orthogonal direction (relative to the edge 163 of the stiffener) between the non-stiffener region 161 and stiffener region 159 at the edge 163 of the stiffener within the tolerance region 157. It is to be appreciated that at least one of the conductive lines 165, 167 can change direction (e.g., loop) after the respective conductive line 165, 167 transitions in an orthogonal direction (relative to the edge 163 of the stiffener 103) between the non-stiffener region 161 and stiffener region 159 at the edge 163 of the stiffener within the tolerance region 157. For example, at least one of the conductive lines 165, 167 changes direction after transitioning no more than once from the non-stiffener region 161 to the stiffener region 159 (and vice versa).

Furthermore, FIG. 1C shows pitches between: (i) two conductive lines 165; (ii) two conductive lines 167; and (iii) a conductive line 165 and a conductive line 167. Each of these pitches are described above in connection with conductive lines 107 and 131. The electrical grounds 121A-B described herein in connection with at least FIG. 1A are also shown in FIGS. 1B-1C.

Returning now to FIG. 1A, performance of a bus (e.g., a high speed input/output (HSIO) bus, etc.) may be limited due to an impedance discontinuity between a three dimensional (3D) transition and a horizontal semiconductor package routing. For one embodiment, the modulation of a conductive line 107's width, the perpendicular relationship between a conductive line 107 and an edge of the stiffener 103, and/or the perpendicular relationship between a conductive line 131 and an edge of the stiffener 103 can assist with reducing this impedance discontinuity, which can in turn assist with improving the bus's performance. For a first example, the stiffener 103 and the trace modulated conductive lines 107 can assist with gradually stepping down an impedance associated with the 3D transition, which can in turn assist with reducing the impedance discontinuity between the 3D transition and the horizontal semiconductor package routing. Consequently, this reduction can assist with improving the bus's performance. For a second example, the stiffener 103 and one or more of the trace modulated conductive lines 107 and the conductive lines 131 can assist with gradually stepping down an impedance associated with the 3D transition, which can in turn assist with reducing the impedance discontinuity between the 3D transition and the horizontal semiconductor package routing. Consequently, this reduction can assist with improving the bus's performance. For one or more embodiments, the package substrate 100 described above in connection with FIGS. 1A-1C can be used for single-ended interfaces, differential interfaces, or a combination thereof.

As explained above, the routing layer 101 may include one or more dielectric layers and/or one or more metal layers. For one embodiment, a dielectric layer and/or a metal layer used to form the routing layer 101 has a reduced thickness (e.g., z-height, etc.) when compared to individual thicknesses of dielectric layers and/or metal layers in conventional routing layers that lack trace width modulated conductive lines 107, the conductive lines 131, a perpendicular relationship between a conductive line 107 and an edge of the stiffener 103, and/or a perpendicular relationship between a conductive line 131 and an edge of the stiffener 103. For brevity, any routing layer lacking one or more of: (i) trace width modulated conductive lines 107; (ii) a conductive line 131; (iii) a perpendicular relationship between a conductive line 107 and an edge of the stiffener 103; and (iv) a perpendicular relationship between a conductive line 131 and an edge of the stiffener 103 is referred to simply a conventional routing layer. Also, and for brevity, any package substrate lacking one or more of: (i) trace width modulated conductive lines 107; (ii) conductive lines 131; (iii) a perpendicular relationship between a conductive line 107 and an edge of the stiffener 103; and (iv) a perpendicular relationship between a conductive line 131 and an edge of the stiffener 103 is referred to simply a conventional package substrate. Furthermore, and for brevity, any stiffener lacking one or more of: (i) a perpendicular relationship between a conductive line 107 and an edge of the stiffener 103; and (ii) a perpendicular relationship between a conductive line 131 and an edge of the stiffener 103 is referred to simply a conventional stiffener. Additionally, and for brevity, any semiconductor package lacking one or more of: (i) trace width modulated conductive lines 107; (ii) conductive lines 131; (iii) a perpendicular relationship between a conductive line 107 and an edge of the stiffener 103; and (iv) a perpendicular relationship between a conductive line 131 and an edge of the stiffener 103 is referred to simply a conventional semiconductor package. Moreover, and for brevity, any conductive line that is not a trace width modulated conductive line 107, is not a conductive line 131, and/or lacks a perpendicular relationship with an edge of the stiffener 103 is referred to simply a conventional conductive line.

For one embodiment, a dielectric layer used to form the routing layer 101 has a reduced thickness (e.g., z-height, etc.) when compared to individual thicknesses of dielectric layers in conventional routing layers. The reduced thickness of the dielectric layer can assist with enhancing electromagnetic wave termination to a reference plane.

For one embodiment, the package substrate 100 having the stiffener 103 thereon has several advantages over a conventional package substrate having a conventional stiffener thereon. For example, a conventional package substrate may include a conventional routing layer with a conventional stiffener thereon, where the conventional routing layer comprises a metal layer, a dielectric layer, or a combination thereof having conventional conductive lines formed in or on the conventional routing layer and where the conventional routing layer is sandwiched between two or more dielectric layers to shield against one or more negative effects attributable, at least in part, to the conventional stiffener. For this conventional package substrate, the conventional stiffener merely provides mechanical support to prevent against warpage and/or delamination of the conventional package substrate. Also, and for this conventional package substrate, each conventional conductive line has a uniform width that remains the same in stiffener and non-stiffener regions. Furthermore, and for this conventional package substrate, each metal and/or dielectric layer may be required to have a minimum thickness (e.g., z-height, etc.) in order to shield the conventional routing layer from negative effects that may be caused by the conventional stiffener. As a result, and for this conventional package substrate, a thickness of the conventional package substrate cannot be reduced by reducing a thickness of the conventional package substrate's layers below the required minimum thickness (e.g., z-height, etc.). In contrast, the package substrate 100 may have a reduced overall thickness (when compared to the conventional package substrate described above). For example, the package substrate 100 may have a z-height that is approximately 70-80 μm less than a z-height of the conventional package substrate described above. This reduced overall thickness is attributable to a lower minimum thicknesses of any metal and/or dielectric layer used to form the routing layer 101 (as opposed to the higher minimum thicknesses of the layers used to form the conventional package substrate described above). The relatively lower minimum thicknesses of any metal or dielectric layers used to form the routing layer 101 are attributable to one or more of the following: (i) trace width modulation of the conductive lines 107, which results in portions 117 and 119 for each of the conductive lines 107; (ii) a perpendicular relationship between the conductive lines 107 and the edges of the stiffener 103; and (iii) a perpendicular relationship between the conductive lines 131 and the edges of the stiffener 103. Additionally, the package substrate 100 may exhibit a more enhanced electromagnetic wave termination to a reference plane than that exhibited by the conventional package substrate described above. This is because of the relatively lower minimum thicknesses of any dielectric layers used to form the routing layer 101 (e.g., one or more microstrip conductive lines formed on or in the routing layer 101, etc.). Furthermore, the impedance tuning improvement and dielectric thickness adjustment described above in connection with the package substrate 100 can assist with improving memory performance (when compared with the conventional package substrate described above). For a first example, memory improvement can be improved by at least one speed bin when compared to the conventional package substrate. For a second example, memory improvement can be improved by two speed bins when compared to the conventional package substrate. Additionally, crosstalk within the package substrate 100 can be reduced or eliminated (when compared to the conventional package substrate described above). For a first example, near end and far end crosstalk may be improved by at least 10 decibels (dB) at 2 gigahertz (GHz) under the stiffener 103 as long as the design rules set forth in one or more of the embodiments described herein are met. For a second example, near end and far end crosstalk may be improved by approximately 20 decibels (dB) at 2 gigahertz (GHz) under the stiffener 103 as long as the design rules set forth in one or more of the embodiments described herein are met. Furthermore, the package substrate 100, which comprises the stiffener 103 and is fabricated using the design rules set forth in one or more of the embodiments described herein, can assist with reducing costs associated with manufacturing and packaging because of the improvements described above.

The advantages described above in connection with the package substrate 100 may assist with mitigating one or more negative effects caused by a stiffener above a package substrate, with reducing a need for investment in specialized equipment required to perform complicated techniques of minimizing the one or more negative effects, with improving performance characteristics of semiconductor packages utilizing stiffeners by improving the semiconductor package's memory performance, with reducing the need for one or more additional layers required to shield stiffeners, which can in turn reduce costs associated with semiconductor manufacturing and/or packaging, with increasing the achievable IO/mm/layer in a semiconductor package, with enhancing one or more properties of a semiconductor package (e.g., enhancing the semiconductor package's electrical performance, etc.), and with reducing a thickness (e.g., z-height, etc.) of the semiconductor package.

Various operations are described in connection with FIGS. 1A-1C (and with the figure(s) described below) as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

The embodiments of conductive lines and/or the stiffener described above in connection with FIGS. 1A-1C can be applied to a board (e.g., a printed circuit board, etc.). Thus, for these embodiments, the board replaces the routing layer 101 and those having ordinary skill will appreciate that this substitution of the board for the routing layer 101 can be performed using information known in the art without undue experimentation.

Figure 2A:
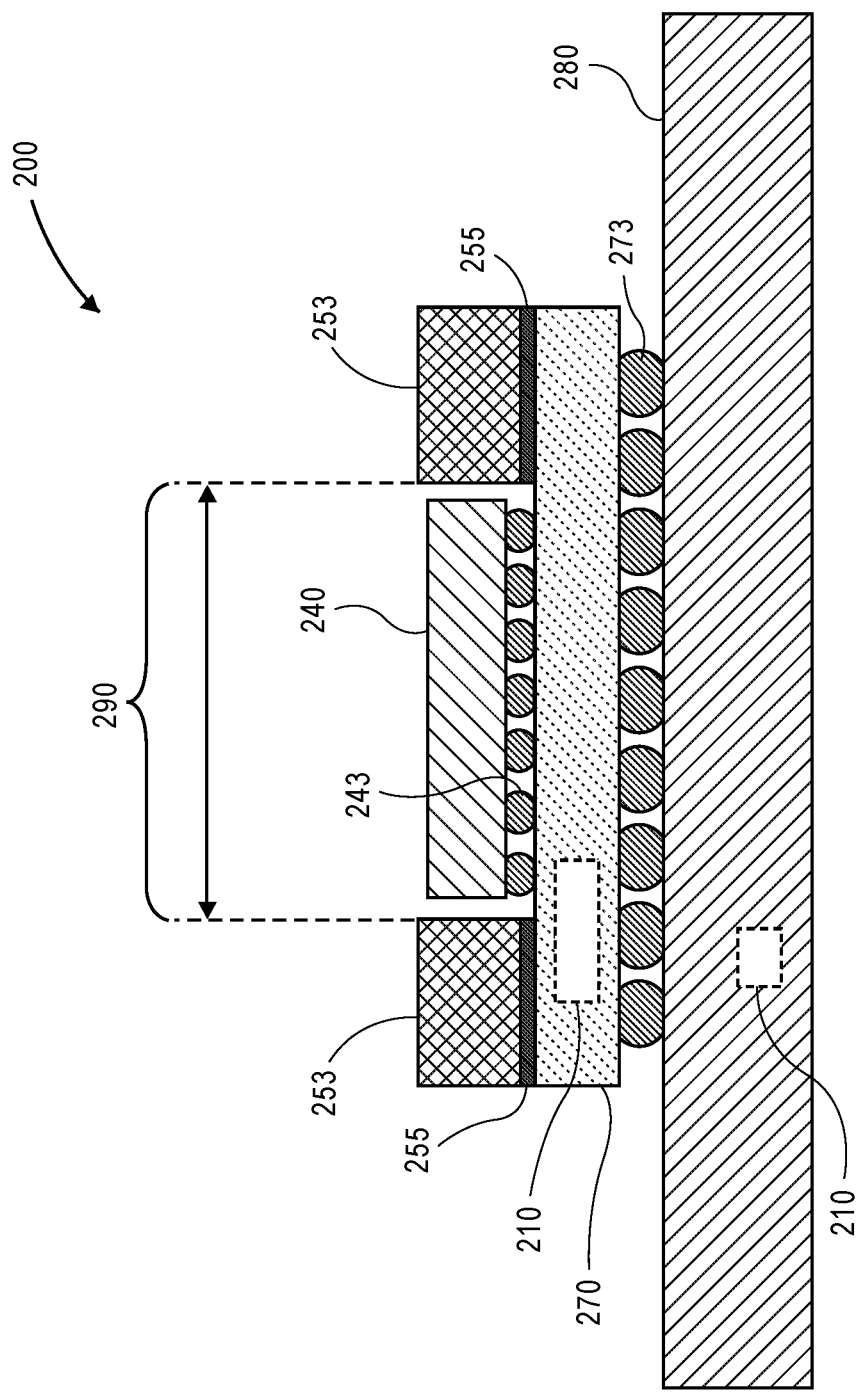
FIGS. 2A-2C illustrate cross-sectional illustration of packaged systems, according to one or more embodiments.

Referring now to FIG. 2A, a cross-sectional illustration of a packaged system 200 is shown, in accordance with an embodiment. For an embodiment, the packaged system 200 may include package substrate 270. The package substrate 270 may comprise one or more layers. The package substrate 270 may comprise a routing layer formed from one or more metal and/or dielectric layers (e.g., the routing layer 101 described above in connection with FIG. 1A, etc.). The routing layer may also include one or more via-pad structures that are similar to or the same as the via-pad structures 121A-B described above in connection with FIGS. 1A-1C.

The packaged system 200 may also include a semiconductor die 240 electrically coupled to the package substrate 270 with interconnect structures 243 (e.g., solder bumps, etc.). The packaged system 200 may also include a stiffener 253 on the package substrate 270 around the die 240. For example, the stiffener 253 may include an opening 290 such that the die 240 fits into the opening 290 when the stiffener 253 is on the package substrate 270. As shown in FIG. 2A, the stiffener 253 may be coupled to the package substrate 270 via an electrically conductive connection mechanism 255. For example, the mechanism 255 may be used to couple the stiffener 253 to one or more structures (not shown) formed in or on the package substrate 270. The one or more structures (e.g., the structures 121A-B described above in connection with FIG. 1A, etc.) may include at least one structure that acts as an electrical ground for the stiffener 253. The mechanism 255 may be formed from solder, conductive epoxy, wire bonds, any other suitable electrically conductive connection mechanism, or any combination thereof. The stiffener 253 may be similar to or the same as the stiffener 103 described above in connection with FIGS. 1A-1C.

As explained above, the package substrate 270 may include a routing layer such as the routing layer 101 described above in connection with FIGS. 1A-1C. Furthermore, the package substrate 270 may include one or more conductive lines 210 formed in accordance with one or more of the embodiments described herein. For one embodiment, a conductive line 210 is similar to or the same as a conductive line 107 described above in connection with FIGS. 1A-1C. For one embodiment, a conductive line 210 is similar to or the same as a conductive line 131 described above in connection with FIGS. 1A-1C.

For additional embodiments, the semiconductor die 240 may be electrically coupled to the package substrate 270 with any suitable interconnect architecture, such as wire bonding or the like. The package substrate 270 may be electrically coupled to a board 280, such as a printed circuit board (PCB), with interconnect structures 273 (e.g., solder bumps, etc.). For additional embodiments, the package substrate 270 may be electrically coupled to a board, such as the PCB 280, with any suitable interconnect architecture, such as wire bonding or the like.

For an embodiment, one or more features (e.g., one or more conductive lines 210, etc.) formed based on one or more of the embodiments described above may be integrated into: (i) the package substrate 270; (ii) the board 280; or (iii) the package substrate 270 and the board 280. Embodiments include any number of features 210 formed into the package substrate 270 and/or the board 280. For example, a plurality of conductive lines 210 may be integrated—for signal propagation or any other desired use—into: (i) the package substrate 270; (ii) the board 280; or (iii) the package substrate 270 and the board 280.

Figure 2B:
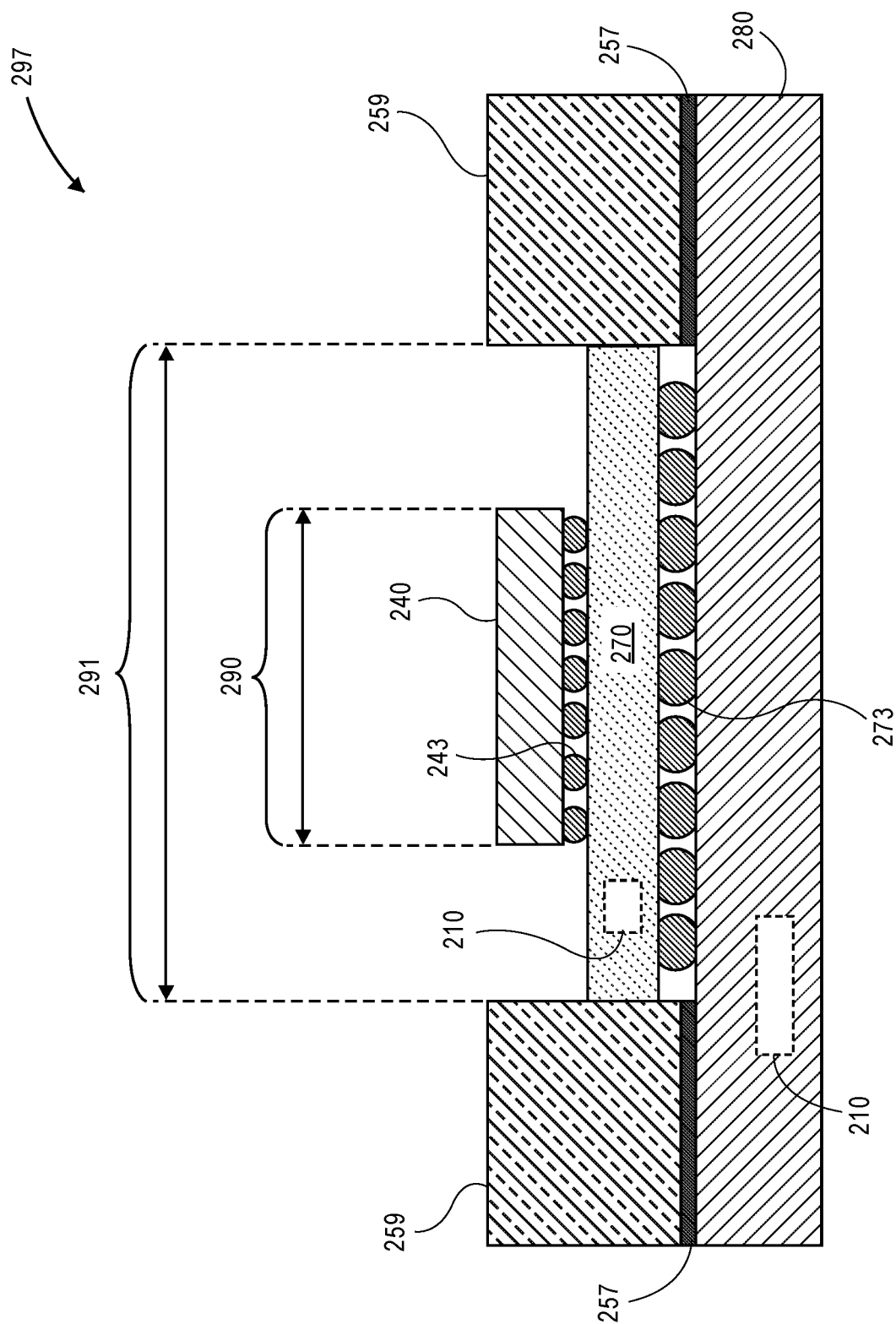

Referring now to FIG. 2B, a cross-sectional illustration of a packaged system 297 is shown, in accordance with an embodiment. The packaged system 297 includes many of the same features described above in connection with the packaged system 200 of FIG. 2A. For brevity, these features are not described again in connection with the packaged system 297 of FIG. 2B.

One difference between the packaged system 200 of FIG. 2A described above and the packaged system 297 of FIG. 2B is that the packaged system 297 includes a stiffener 259 on the board 280 around the package substrate 270, the stiffener 253, and the interconnect structures 273. For one embodiment, the stiffener 259 is similar to or the same as the stiffener 103 described above in connection with FIGS. 1A-1C. For one embodiment, conductive lines 210 formed in or on the board 280 are similar to or the same the conductive lines 107 described above in connection with FIGS. 1A-1C. For one embodiment, conductive lines 210 formed in or on the board 280 are similar to or the same the conductive lines 131 described above in connection with FIGS. 1A-1C. For one embodiment, the stiffener 259 may include an opening 291 such that the package substrate 270, the stiffener 253, and the interconnect structures 273 fit into the opening 291 when the stiffener 259 is on the board 280. As shown in FIG. 2A, the stiffener 259 may be coupled to the board 280 via an electrically conductive connection mechanism 257. For example, the mechanism 257 may be used to couple the stiffener 259 to one or more structures (not shown) formed in or on the board 280. The one or more structures (e.g., the structures 121A-B described above in connection with FIGS. 1A-1C, etc.) may include at least one structure that acts as an electrical ground for the stiffener 259. The mechanism 257 may be formed from solder, conductive epoxy, wire bonds, any other suitable electrically conductive connection mechanism, or any combination thereof.

Figure 2C:
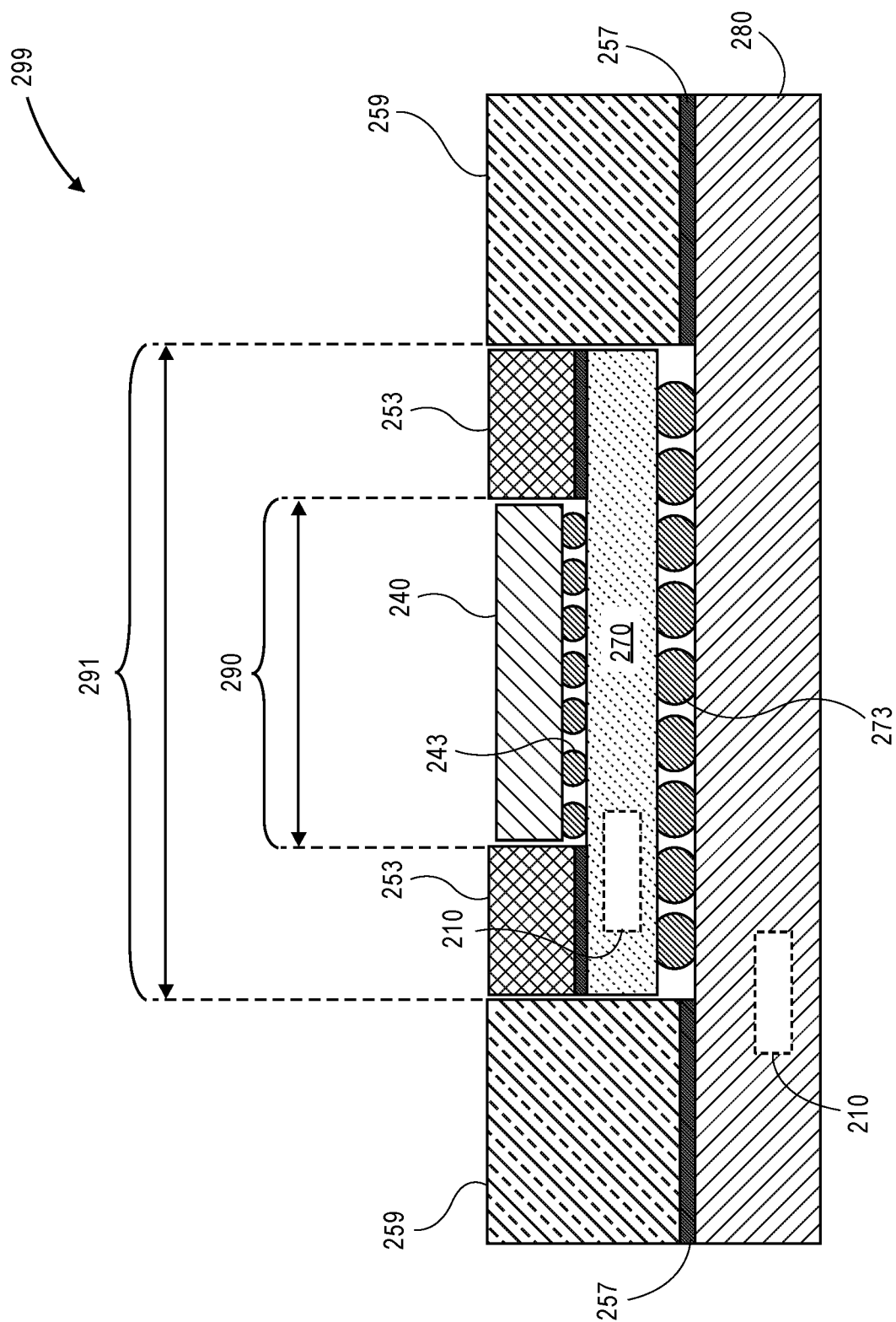

Another difference between the packaged system 200 of FIG. 2A described above and the packaged system 297 of FIG. 2B is that the packaged system 297 does not include the stiffener 253 on the package substrate 270 or the coupling mechanism 255 used to couple the stiffener 253 onto the package substrate 270. In spite of this difference, it is to be appreciated that the packaged systems 200 and 297 may be combined. For example, the packaged system 299 illustrated in FIG. 2C is a combination of the packaged systems 200 and 297. Packaged system 299 includes all of the features described above in connection with the packaged systems 200 and 297 of FIGS. 2A and 2B, respectively. For brevity, these features are not described again.

Figure 3:
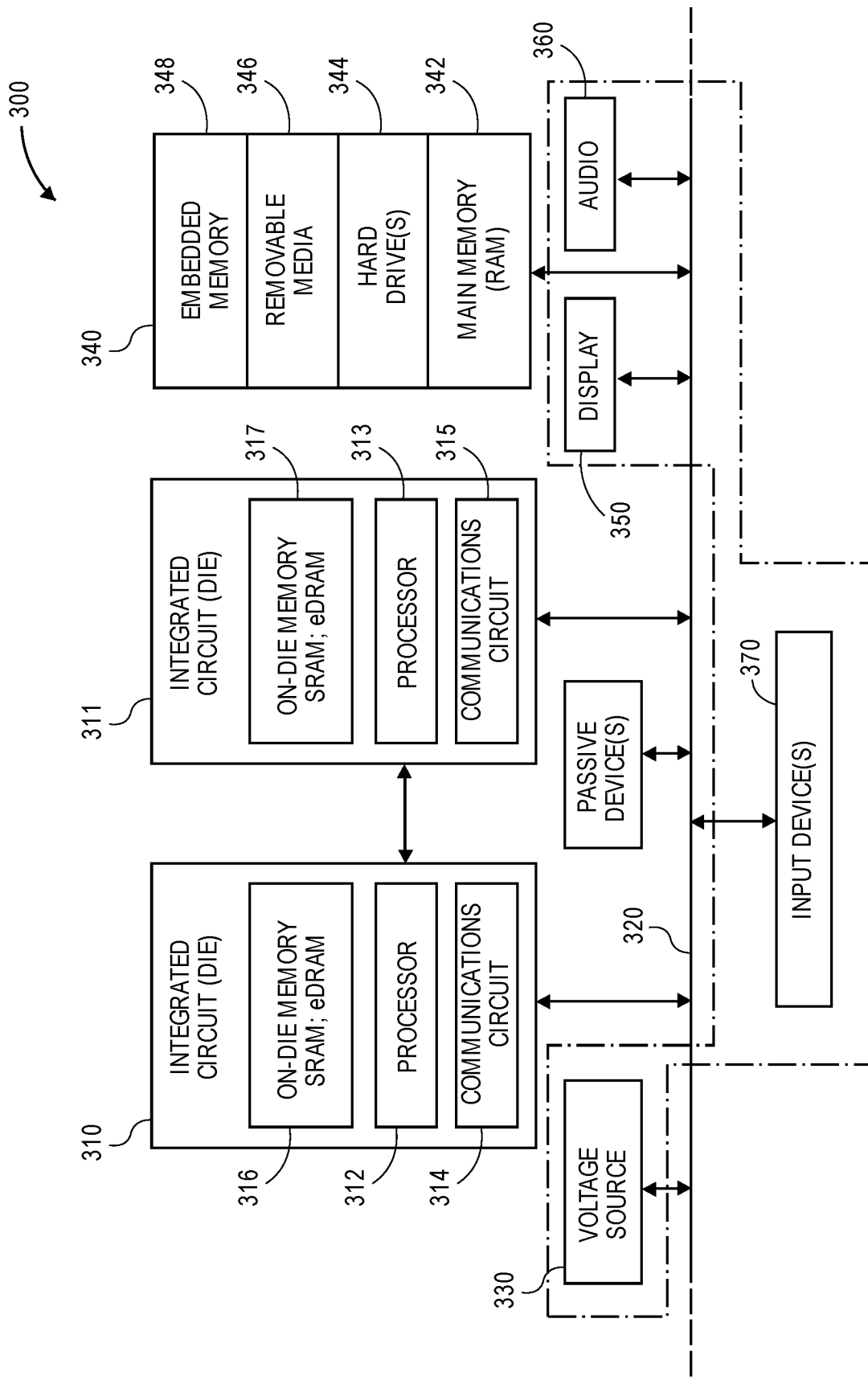
FIG. 3 is an illustration of a schematic block diagram of a computer system that utilizes a semiconductor package, according to an embodiment.

FIG. 3 illustrates a schematic of computer system 300 according to an embodiment. The computer system 300 (also referred to as an electronic system 300) can include a semiconductor package comprising a package substrate and/or a stiffener in accordance with any of the embodiments and their equivalents as set forth in this disclosure. The computer system 300 may be a mobile device, a netbook computer, a wireless smart phone, a desktop computer, a hand-held reader, a server system, a supercomputer, or a high-performance computing system.

The system 300 can be a computer system that includes a system bus 320 to electrically couple the various components of the electronic system 300. The system bus 320 is a single bus or any combination of busses according to various embodiments. The electronic system 300 includes a voltage source 330 that provides power to the integrated circuit 310. For one embodiment, the voltage source 330 supplies current to the integrated circuit 310 through the system bus 320.

The integrated circuit 310 is electrically coupled to the system bus 320 and includes any circuit, or combination of circuits according to an embodiment. For an embodiment, the integrated circuit 310 includes a processor 312. As used herein, the processor 312 may mean any type of circuit such as, but not limited to, a microprocessor, a microcontroller, a graphics processor, a digital signal processor, or another processor. For an embodiment, the processor 312 includes, or is coupled with, a semiconductor package comprising a package substrate and/or a stiffener in accordance with any of the embodiments and their equivalents, as described in the foregoing specification. For an embodiment, SRAM embodiments are found in memory caches of the processor. Other types of circuits that can be included in the integrated circuit 310 are a custom circuit or an application-specific integrated circuit (ASIC), such as a communications circuit 314 for use in wireless devices such as cellular telephones, smart phones, pagers, portable computers, two-way radios, and similar electronic systems, or a communications circuit for servers. For an embodiment, the integrated circuit 310 includes on-die memory 316 such as static random-access memory (SRAM). For an embodiment, the integrated circuit 310 includes embedded on-die memory 316 such as embedded dynamic random-access memory (eDRAM). For one embodiment, the on-die memory 316 may be semiconductor packaged with a process in accord with any of the embodiments and their equivalents, as described in the foregoing specification.

For an embodiment, the integrated circuit 310 is complemented with a subsequent integrated circuit 311. Useful embodiments include a dual processor 313 and a dual communications circuit 315 and dual on-die memory 317 such as SRAM. For an embodiment, the dual integrated circuit 310 includes embedded on-die memory 317 such as eDRAM.

For an embodiment, the electronic system 300 also includes an external memory 340 that in turn may include one or more memory elements suitable to the particular application, such as a main memory 342 in the form of RAM, one or more hard drives 344, and/or one or more drives that handle removable media 346, such as diskettes, compact disks (CDs), digital variable disks (DVDs), flash memory drives, and other removable media known in the art. The external memory 340 may also be embedded memory 348 such as the first die in a die stack, according to an embodiment.

For an embodiment, the electronic system 300 also includes a display device 350 and an audio output 360. For an embodiment, the electronic system 300 includes an input device such as a controller 370 that may be a keyboard, mouse, trackball, game controller, microphone, voice-recognition device, or any other input device that inputs information into the electronic system 300. For an embodiment, an input device 370 is a camera. For an embodiment, an input device 370 is a digital sound recorder. For an embodiment, an input device 370 is a camera and a digital sound recorder.

At least one of the integrated circuits 310 or 311 can be implemented in a number of different embodiments, including a semiconductor package comprising a package substrate and/or a stiffener as described herein, an electronic system, a computer system, one or more methods of fabricating an integrated circuit, and one or more methods of fabricating an electronic assembly that includes a semiconductor package comprising a package substrate and/or a stiffener, according to any disclosed embodiments set forth herein and their art-recognized equivalents. The elements, materials, geometries, dimensions, and sequence of operations can all be varied to suit particular I/O coupling requirements including array contact count, array contact configuration for a microelectronic die embedded in a processor mounting substrate according to a semiconductor package comprising a package substrate and/or a stiffener in accordance with any of the disclosed embodiments as set forth herein and their art-recognized equivalents. A foundation substrate may be included, as represented by the dashed line of FIG. 3. Passive devices may also be included, as is also depicted in FIG. 3.

Reference throughout this specification to "one embodiment," "an embodiment," "another embodiment" and their variations means that a particular feature, structure, configuration, or characteristic described in connection with the embodiment is included in at least one embodiment. Thus, the appearances of the phrase "for one embodiment," "for an embodiment," "for another embodiment," "in one embodiment," "in an embodiment," "in another embodiment," or their variations in various places throughout this specification are not necessarily referring to the same embodiment. Furthermore, the particular features, structures, configurations, or characteristics may be combined in any suitable manner in one or more embodiments.

The terms "over," "to," "between," "onto," and "on" as used in the foregoing specification refer to a relative position of one layer with respect to other layers. One layer "over" or "on" another layer or bonded "to" or in "contact" with another layer may be directly in contact with the other layer or may have one or more intervening layers. One layer "between" layers may be directly in contact with the layers or may have one or more intervening layers.

The description provided above in connection with one or more embodiments as described herein that is included as part of a process of forming semiconductor packages may also be used for other types of IC semiconductor packages and mixed logic-memory semiconductor package stacks. In addition, the processing sequences may be compatible with both wafer level semiconductor packages (WLP), and integration with surface mount substrates such as LGA, QFN, and ceramic substrates.

In the foregoing specification, abstract, and/or figures, numerous specific details are set forth, such as specific materials and processing operations, in order to provide a thorough understanding of embodiments described herein. It will, however, be evident that any of the embodiments described herein may be practiced without these specific details. In other instances, well-known features, such as the integrated circuitry of semi conductive dies, are not described in detail in order to not unnecessarily obscure embodiments described herein. Furthermore, it is to be understood that the various embodiments shown in the Figures and described in connection with the Figures are illustrative representations and are not necessarily drawn to scale. Thus, various modifications and/or changes may be made without departing form the broader spirit and scope of the embodiments described in connection with the foregoing specification, abstract, and/or Figures.

Embodiments described herein include a package substrate, comprising: a routing layer, the routing layer comprising a dielectric layer; a stiffener above the routing layer, the stiffener comprising an opening; and a conductive line on the routing layer, the conductive line comprising a first portion and a second portion, the first portion having a first width, the second portion having a second width, the conductive line extending from a first region of the routing layer to a second region of the routing layer, the first region being under the stiffener, the second region being outside the stiffener, the first portion being on the first region, and the second portion being on the second region.

Additional embodiments described herein include a package substrate, wherein the first width is less than or equal to the second width.

Additional embodiments described herein include a package substrate, wherein at least one portion of the conductive line is perpendicular to an edge of the stiffener on the conductive line.

Additional embodiments described herein include a package substrate, wherein the at least one portion of the conductive line that is perpendicular to the edge of the stiffener comprises a transition from the first width to the second width.

Additional embodiments described herein include a package substrate, wherein the stiffener includes an exclusion zone and wherein no conductive line on the routing layer is under the exclusion zone.

Additional embodiments described herein include a package substrate, wherein the conductive line transitions from the first width to the second width within a tolerance region.

Additional embodiments described herein include a package substrate, wherein an edge of the stiffener is within the tolerance region.

Additional embodiments described herein include a package substrate, further comprising another conductive line adjacently located on the routing layer next to the conductive line, wherein a pitch between the two adjacent conductive lines is a selected from a range of values comprising 18-80 micrometers (μm).

Additional embodiments described herein include a package substrate, wherein the first width is less than or equal to 18 μm and the second width is greater than or equal to 34 μm.

Additional embodiments described herein include a package substrate, wherein a ratio of the first width to the second width is 9:17.

Additional embodiments described herein include a package substrate, wherein a length of the stiffener is approximately equal or equal to 8000 μm.

Additional embodiments described herein include a package substrate, wherein an electrical ground is positioned on the routing layer at half the length of the stiffener.

Additional embodiments described herein include a package substrate, wherein a clearing area on the routing layer between an electrical ground and an edge of the stiffener is less than, approximately equal to, or equal to 310 μm.

Additional embodiments described herein include a package substrate, wherein an impedance of the conductive line is less than, approximately equal to, or equal to 40 ohms (Ω).

Embodiments described herein include a method of fabricating a package substrate, comprising: forming a routing layer, the routing layer comprising a dielectric layer; placing a stiffener above the routing layer, the stiffener comprising an opening; and forming a conductive line on the routing layer, the conductive line comprising a first portion and a second portion, the first portion having a first width, the second portion having a second width, the conductive line extending from a first region of the routing layer to a second region of the routing layer, the first region being under the stiffener, the second region being outside the stiffener, the first portion being on the first region, and the second portion being on the second region.

Additional embodiments described herein include a method, wherein the first width is less than or equal to the second width.

Additional embodiments described herein include a method, wherein forming a conductive line on the routing layer comprises forming at least one portion of the conductive line to be perpendicular to an edge of the stiffener on the conductive line.

Additional embodiments described herein include a method, wherein forming at least one portion of the conductive line to be perpendicular to an edge of the stiffener on the conductive line comprises forming the at least one portion of the conductive line that is perpendicular to the edge of the stiffener to comprise a transition from the first width to the second width.

Additional embodiments described herein include a method, wherein the stiffener includes an exclusion zone and wherein no conductive line on the routing layer is under the exclusion zone.

Additional embodiments described herein include a method, further comprising another conductive line adjacently located on the routing layer next to the conductive line, wherein a pitch between the two adjacent conductive lines is a function of a difference between the first width and the second width.

Additional embodiments described herein include a method, further comprising forming another conductive line adjacently located on the routing layer next to the conductive line, wherein a pitch between the two adjacent conductive lines is a selected from a range of values comprising 18-80 micrometers (μm).

Additional embodiments described herein include a method, wherein the first width is less than or equal to 18 μm and the second width is greater than or equal to 34 μm.

Additional embodiments described herein include a method, wherein a ratio of the first width to the second width is 9:17.

Additional embodiments described herein include a method, wherein the conductive line transitions from the first width to the second width within a tolerance region and wherein an edge of the stiffener is within the tolerance region.

Additional embodiments described herein include a method, wherein a length of the stiffener is approximately equal or equal to 8000 µm.

Additional embodiments described herein include a method, wherein an electrical ground is positioned on the routing layer at half the length of the stiffener.

Additional embodiments described herein include a method, wherein a clearing area on the routing layer between an electrical ground and an edge of the stiffener is less than, approximately equal to, or equal to 310 µm.

Additional embodiments described herein include a method, wherein an impedance of the conductive line is less than, approximately equal to, or equal to 40 ohms (Ω).

Embodiments described herein include a semiconductor package, comprising: a routing layer, the routing layer comprising a dielectric layer; a stiffener above the routing layer, the stiffener comprising an opening; a semiconductor die on the routing layer, wherein the semiconductor die fits into the opening of the stiffener; and a conductive line on the routing layer, the conductive line comprising a first portion and a second portion, the first portion having a first width, the second portion having a second width, the conductive line extending from a first region of the routing layer to a second region of the routing layer, the first region being under the stiffener, the second region being outside the stiffener, the first portion being on the first region, and the second portion being on the second region.

Additional embodiments described herein include a semiconductor package, wherein the first width is less than or equal to the second width.

Additional embodiments described herein include a semiconductor package, wherein at least one portion of the conductive line is perpendicular to an edge of the stiffener on the conductive line.

Additional embodiments described herein include a semiconductor package, wherein the at least one portion of the conductive line that is perpendicular to the edge of the stiffener comprises a transition from the first width to the second width.

Additional embodiments described herein include a semiconductor package, wherein the stiffener includes an exclusion zone and wherein no conductive line on the routing layer is under the exclusion zone.

Additional embodiments described herein include a semiconductor package, further comprising another conductive line adjacently located on the routing layer next to the conductive line, wherein a pitch between the two adjacent conductive lines is a selected from a range of values comprising 18-80 micrometers (µm).

Additional embodiments described herein include a semiconductor package, wherein the first width is less than or equal to 18 µm and the second width is greater than or equal to 34 µm.

Additional embodiments described herein include a semiconductor package, wherein a diameter of the via-pad structure is less than, approximately equal to, or equal to 220 µm.

Additional embodiments described herein include a semiconductor package, wherein a ratio of the first width to the second width is 9:17.

Additional embodiments described herein include a semiconductor package, wherein a length of the stiffener is approximately equal or equal to 8000 µm.

Additional embodiments described herein include a semiconductor package, wherein an electrical ground is positioned on the routing layer at half the length of the stiffener.

Additional embodiments described herein include a semiconductor package, wherein a clearing area on the routing layer between an electrical ground and an edge of the stiffener is less than, approximately equal to, or equal to 310 µm.

Additional embodiments described herein include a semiconductor package, wherein an impedance of the conductive line is less than, approximately equal to, or equal to 40 ohms (Ω).

Embodiments described herein include a semiconductor package, comprising: a package substrate as set forth in one or more of the preceding embodiments.

Embodiments described herein include a system, comprising: a semiconductor package on a board; a stiffener above the board around the semiconductor package; and a conductive line formed in or on the board, the conductive line comprising a first portion and a second portion, the first portion having a first width, the second portion having a second width, the conductive line extending from a first region of the board to a second region of the board, the first region being under the stiffener, the second region being outside the stiffener, the first portion being on the first region, and the second portion being on the second region.

Additional embodiments described herein include a system, wherein the first width is less than or equal to the second width.

Additional embodiments described herein include a system, wherein at least one portion of the conductive line is perpendicular to an edge of the stiffener on the conductive line.

Additional embodiments described herein include a system, wherein the at least one portion of the conductive line that is perpendicular to the edge of the stiffener comprises a transition from the first width to the second width.

Additional embodiments described herein include a system, wherein the stiffener includes an exclusion zone and wherein no conductive line on the routing layer is under the exclusion zone.

Additional embodiments described herein include a system, further comprising another conductive line adjacently located on the board next to the conductive line, wherein a pitch between the two adjacent conductive lines is a selected from a range of values comprising 18-80 micrometers (µm).

Additional embodiments described herein include a system, wherein the first width is less than or equal to 18 µm and the second width is greater than or equal to 34 µm.

Additional embodiments described herein include a system, wherein a ratio of the first width to the second width is 9:17.

Additional embodiments described herein include a system, wherein the conductive line transitions from the first width to the second width within a tolerance region and wherein an edge of the stiffener is within the tolerance region.

Additional embodiments described herein include a system, wherein a length of the stiffener is approximately equal or equal to 8000 µm.

Additional embodiments described herein include a system, wherein an electrical ground is positioned on the board at half the length of the stiffener.

Additional embodiments described herein include a system, wherein a clearing area on the board between an electrical ground and an edge of the stiffener is less than, approximately equal to, or equal to 310 µm.

Additional embodiments described herein include a system, wherein an impedance of the conductive line is less than, approximately equal to, or equal to 40 ohms (Ω).

Embodiments described herein include a system according to one or more of the preceding embodiments of systems, the system comprising a semiconductor package, the semiconductor package comprising a package substrate as set forth in one or more of the preceding embodiments of package substrates.

Embodiments described herein include a package substrate, comprising: a routing layer, the routing layer comprising a dielectric layer; a stiffener above the routing layer, the stiffener comprising an opening; a first conductive line on the routing layer, the first conductive line comprising a first portion and a second portion, the first portion having a first width, the second portion having a second width, the first conductive line extending from a first region of the routing layer to a second region of the routing layer, the first region being under the stiffener, the second region being outside the stiffener, the first portion being on the first region, and the second portion being on the second region; and a second conductive line on the routing layer.

Additional embodiments described herein include a package substrate, wherein the first width is less than or equal to the second width.

Additional embodiments described herein include a package substrate, wherein the second conductive line has a third width that is less than or equal to the first width.

Additional embodiments described herein include a package substrate, wherein the second conductive line has a third width that is less than or equal to the second width.

Additional embodiments described herein include a package substrate, wherein at least one portion of the first conductive line is perpendicular to an edge of the stiffener on the conductive line.

Additional embodiments described herein include a package substrate, wherein the at least one portion of the conductive line that is perpendicular to the edge of the stiffener comprises a transition from the first width to the second width.

Additional embodiments described herein include a package substrate, wherein at least one portion of the second conductive line is perpendicular to an edge of the stiffener on the conductive line.

Additional embodiments described herein include a package substrate, wherein the stiffener includes an exclusion zone and wherein no conductive line on the routing layer is under the exclusion zone.

Additional embodiments described herein include a package substrate, further comprising a third conductive line adjacently located on the routing layer next to the first conductive line, wherein a pitch between the two adjacent conductive lines is a function of a difference between the first width and the second width.

Additional embodiments described herein include a package substrate, further comprising a third conductive line adjacently located on the routing layer next to the first conductive line, wherein a pitch between the two adjacent conductive lines is a selected from a range of values comprising 18-80 micrometers ($\mu$m).

Additional embodiments described herein include a package substrate, further comprising a third conductive line adjacently located on the routing layer next to the second conductive line, wherein a pitch between the two adjacent conductive lines is a selected from a range of values comprising 18-80 micrometers ($\mu$m).

Additional embodiments described herein include a package substrate, wherein the first width is less than or equal to 18 $\mu$m and the second width is greater than or equal to 34 $\mu$m.

Additional embodiments described herein include a package substrate, wherein a ratio of the first width to the second width is 9:17.

Additional embodiments described herein include a package substrate, wherein the conductive line transitions from the first width to the second width within a tolerance region and wherein an edge of the stiffener is within the tolerance region.

Additional embodiments described herein include a package substrate, wherein a length of the stiffener is approximately equal or equal to 8000 $\mu$m.

Additional embodiments described herein include a package substrate, wherein an electrical ground is positioned on the routing layer at half the length of the stiffener.

Additional embodiments described herein include a package substrate, wherein a clearing area on the routing layer between an electrical ground and an edge of the stiffener is less than, approximately equal to, or equal to 310 $\mu$m.

Additional embodiments described herein include a package substrate, wherein an impedance of the first conductive line is less than, approximately equal to, or equal to 40 ohms ($\Omega$).

Embodiments described herein include a method of fabricating a package substrate, comprising: forming a routing layer, the routing layer comprising a dielectric layer; placing a stiffener above the routing layer, the stiffener comprising an opening; forming a first conductive line on the routing layer, the first conductive line comprising a first portion and a second portion, the first portion having a first width, the second portion having a second width, the first conductive line extending from a first region of the routing layer to a second region of the routing layer, the first region being under the stiffener, the second region being outside the stiffener, the first portion being on the first region, and the second portion being on the second region; and forming a second conductive line on the routing layer.

Additional embodiments described herein include a method, wherein the first width is less than or equal to the second width.

Additional embodiments described herein include a method, wherein the second conductive line has a third width that is less than or equal to the first width.

Additional embodiments described herein include a method, wherein the second conductive line has a third width that is less than or equal to the second width.

Additional embodiments described herein include a method, wherein forming the first conductive line on the routing layer comprises forming at least one portion of the first conductive line to be perpendicular to an edge of the stiffener on the first conductive line.

Additional embodiments described herein include a method, wherein forming at least one portion of the first conductive line to be perpendicular to an edge of the stiffener on the first conductive line comprises forming the at least one portion of the conductive line that is perpendicular to the edge of the stiffener to comprise a transition from the first width to the second width.

Additional embodiments described herein include a method, wherein forming the second conductive line on the routing layer comprises forming at least one portion of the second conductive line to be perpendicular to an edge of the stiffener on the second conductive line.

Additional embodiments described herein include a method, wherein the stiffener includes an exclusion zone and wherein no conductive line on the routing layer is under the exclusion zone.

Additional embodiments described herein include a method, further comprising forming a third conductive line adjacently located on the routing layer next to the first conductive line, wherein a pitch between the two adjacent conductive lines is a function of a difference between the first width and the second width.

Additional embodiments described herein include a method, further comprising forming a third conductive line adjacently located on the routing layer next to the first conductive line, wherein a pitch between the two adjacent conductive lines is a selected from a range of values comprising 18-80 micrometers (μm).

Additional embodiments described herein include a method, further comprising forming a third conductive line adjacently located on the routing layer next to the second conductive line, wherein a pitch between the two adjacent conductive lines is a selected from a range of values comprising 18-80 micrometers (μm).

Additional embodiments described herein include a method, wherein the first width is less than or equal to 18 μm and the second width is greater than or equal to 34 μm.

Additional embodiments described herein include a method, wherein a ratio of the first width to the second width is 9:17.

Additional embodiments described herein include a method, wherein the conductive line transitions from the first width to the second width within a tolerance region and wherein an edge of the stiffener is within the tolerance region.

Additional embodiments described herein include a method, wherein a length of the stiffener is approximately equal or equal to 8000 μm.

Additional embodiments described herein include a method, wherein an electrical ground is positioned on the routing layer at half the length of the stiffener.

Additional embodiments described herein include a method, wherein a clearing area on the routing layer between an electrical ground and an edge of the stiffener is less than, approximately equal to, or equal to 310 μm.

Additional embodiments described herein include a method, wherein an impedance of the first conductive line is less than, approximately equal to, or equal to 40 ohms (Ω).

Embodiments described herein include a semiconductor package, comprising: a routing layer, the routing layer comprising a dielectric layer; a stiffener above the routing layer, the stiffener comprising an opening; a semiconductor die on the routing layer, wherein the semiconductor die fits into the opening of the stiffener; a first conductive line on the routing layer, the conductive line comprising a first portion and a second portion, the first portion having a first width, the second portion having a second width, the conductive line extending from a first region of the routing layer to a second region of the routing layer, the first region being under the stiffener, the second region being outside the stiffener, the first portion being on the first region, and the second portion being on the second region; and a second conductive line on the routing layer.

Additional embodiments described herein include a semiconductor package, wherein the first width is less than or equal to the second width.

Additional embodiments described herein include a semiconductor package, wherein the second conductive line has a third width that is less than or equal to the first width.

Additional embodiments described herein include a semiconductor package, wherein the second conductive line has a third width that is less than or equal to the second width.

Additional embodiments described herein include a semiconductor package, wherein at least one portion of the first conductive line is perpendicular to an edge of the stiffener on the first conductive line.

Additional embodiments described herein include a semiconductor package, wherein the at least one portion of the first conductive line that is perpendicular to the edge of the stiffener on the first conductive line comprises a transition from the first width to the second width.

Additional embodiments described herein include a semiconductor package, wherein at least one portion of the second conductive line is perpendicular to an edge of the stiffener on the second conductive line.

Additional embodiments described herein include a semiconductor package, wherein the stiffener includes an exclusion zone and wherein no conductive line on the routing layer is under the exclusion zone.

Additional embodiments described herein include a semiconductor package, further comprising a third conductive line adjacently located on the routing layer next to the first conductive line, wherein a pitch between the two adjacent conductive lines is a function of a difference between the first width and the second width.

Additional embodiments described herein include a semiconductor package, further comprising a third conductive line adjacently located on the routing layer next to the first conductive line, wherein a pitch between the two adjacent conductive lines is a selected from a range of values comprising 18-80 micrometers (μm).

Additional embodiments described herein include a semiconductor package, further comprising a third conductive line adjacently located on the routing layer next to the second conductive line, wherein a pitch between the two adjacent conductive lines is a selected from a range of values comprising 18-80 micrometers (μm).

Additional embodiments described herein include a semiconductor package, wherein the first width is less than or equal to 18 μm and the second width is greater than or equal to 34 μm.

Additional embodiments described herein include a semiconductor package, wherein a ratio of the first width to the second width is 9:17.

Additional embodiments described herein include a semiconductor package, wherein the conductive line transitions from the first width to the second width within a tolerance region and wherein an edge of the stiffener is within the tolerance region.

Additional embodiments described herein include a semiconductor package, wherein a length of the stiffener is approximately equal or equal to 8000 μm.

Additional embodiments described herein include a semiconductor package, wherein an electrical ground is positioned on the routing layer at half the length of the stiffener.

Additional embodiments described herein include a semiconductor package, wherein a clearing area on the routing layer between an electrical ground and an edge of the stiffener is less than, approximately equal to, or equal to 310 μm.

Additional embodiments described herein include a semiconductor package, wherein an impedance of the first conductive line is less than, approximately equal to, or equal to 40 ohms (Ω).

Embodiments described herein include a system according to one or more of the preceding embodiments, the system comprising a semiconductor package as set forth in one or more of the preceding embodiments of semiconductor packages.

Embodiments described herein include a system according to one or more of the preceding embodiments, the system comprising a package substrate as set forth in one or more of the preceding embodiments of package substrates.

Embodiments described herein include a system according to one or more of the preceding embodiments, the system comprising a semiconductor package, the semiconductor package comprising a package substrate as set forth in one or more of the preceding embodiments of package substrates.

Embodiments described herein include one or more of the preceding embodiments, wherein a ratio of the first width to the second width is 9:17.

Embodiments described herein include one or more of the preceding embodiments, wherein an edge of a stiffener is in tolerance region.

Embodiments described herein include one or more of the preceding embodiments, wherein the conductive line transitions from the first width to the second width within the tolerance region.

Embodiments described herein include one or more of the preceding embodiments, wherein the tolerance region has a width of 250 µm.

In the description, drawings, and claims provided herein, the use of "at least one of A, B, and C", "at least one of A, B, or C", "one or more of A, B, or C", or "one or more of A, B, and C" is intended encompass: (i) A alone; (ii) B alone; (iii) C alone; (iv) A and B together; (v) A and C together; (vi) B and C together; or (vii) A, B, and C together. Furthermore, the use of "A, B, and/or C" is intended encompass: (i) A alone; (ii) B alone; (iii) C alone; (iv) A and B together; (v) A and C together; (vi) B and C together; or (vii) A, B, and C together. It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrases "A or B", "A and B", and "A and/or B" will be understood to include the possibilities of "A alone" or "B alone" or "A and B."

The terms "via" and its variations refer to a vertical interconnect access as is known in the art. One example of a via is a conductive via.

The terms used in the following claims should not be construed to limit any embodiments described in connection with the foregoing specification, abstract, and/or Figures to the specific embodiments set forth in the foregoing specification, abstract, Figures, and/or claims. Rather, the scope of the claims are to be construed in accordance with established doctrines of claim interpretation.

What is claimed is:

1. A package substrate, comprising:
   a routing layer, the routing layer comprising a dielectric layer;
   a stiffener above the routing layer, the stiffener comprising an opening; and
   a conductive line on the routing layer, the conductive line comprising a first portion and a second portion continuous along a length, the first portion having a first width, the second portion having a second width different than the first width, the conductive line extending from a first region of the routing layer to a second region of the routing layer, the first region being under the stiffener, the second region being outside the stiffener, the first portion being on the first region, and the second portion being on the second region.

2. The package substrate of claim 1, wherein the first width is less than the second width.

3. The package substrate of claim 1, wherein at least one portion of the conductive line is perpendicular to an edge of the stiffener on the conductive line.

4. The package substrate of claim 3, wherein the at least one portion of the conductive line that is perpendicular to the edge of the stiffener comprises a transition from the first width to the second width.

5. The package substrate of claim 1, wherein the stiffener includes an exclusion zone and wherein no conductive line on the routing layer is under the exclusion zone.

6. The package substrate of claim 1, further comprising another conductive line adjacently located on the routing layer next to the conductive line, wherein a pitch between the two adjacent conductive lines is a function of a difference between the first width and the second width.

7. The package substrate of claim 1, further comprising another conductive line adjacently located on the routing layer next to the conductive line, wherein a pitch between the two adjacent conductive lines is a selected from a range of values comprising 18-80 micrometers (µm).

8. The package substrate of claim 1, wherein the first width is less than or equal to 18 µm and the second width is greater than or equal to 34 µm.

9. The package substrate of claim 1, wherein a ratio of the first width to the second width is 9:17.

10. The package substrate of claim 1, wherein the conductive line transitions from the first width to the second width within a tolerance region and wherein an edge of the stiffener is within the tolerance region.

11. The package substrate of claim 1, wherein a length of the stiffener is less than, approximately equal to, or equal to 8000 µm.

12. The package substrate of claim 11, wherein an electrical ground is positioned on the routing layer at half the length of the stiffener.

13. The package substrate of claim 1, wherein a clearing area on the routing layer between an electrical ground and an edge of the stiffener is less than, approximately equal to, or equal to 310 µm.

14. The package substrate of claim 1, wherein an impedance of the conductive line is less than, approximately equal to, or equal to 40 ohms ($\Omega$).

15. A method of fabricating a package substrate, comprising:
    forming a routing layer, the routing layer comprising a dielectric layer;
    placing a stiffener above the routing layer, the stiffener comprising an opening; and
    forming a conductive line on the routing layer, the conductive line comprising a first portion and a second portion continuous along a length, the first portion having a first width, the second portion having a second width different than the first width, the conductive line extending from a first region of the routing layer to a second region of the routing layer, the first region being under the stiffener, the second region being outside the stiffener, the first portion being on the first region, and the second portion being on the second region.

16. The method of claim 15, wherein the first width is less than the second width.

17. The method of claim 15, wherein forming a conductive line on the routing layer comprises forming at least one portion of the conductive line to be perpendicular to an edge of the stiffener on the conductive line.

18. The method of claim 17, wherein forming at least one portion of the conductive line to be perpendicular to an edge of the stiffener on the conductive line comprises forming the at least one portion of the conductive line that is perpendicular to the edge of the stiffener to comprise a transition from the first width to the second width.

19. The method of claim 18, wherein the conductive line transitions from the first width to the second width within a tolerance region and wherein an edge of the stiffener is within the tolerance region.

20. The method of claim 15, wherein the stiffener includes an exclusion zone and wherein no conductive line on the routing layer is under the exclusion zone.

21. A package substrate, comprising:
a routing layer, the routing layer comprising a dielectric layer;
a stiffener above the routing layer, the stiffener comprising an opening;
a semiconductor die on the routing layer, wherein the semiconductor die fits into the opening of the stiffener;
a first conductive line on the routing layer, the first conductive line comprising a first portion and a second portion continuous along a length, the first portion having a first width, the second portion having a second width different than the first width, the first conductive line extending from a first region of the routing layer to a second region of the routing layer, the first region being under the stiffener, the second region being outside the stiffener, the first portion being on the first region, and the second portion being on the second region; and
a second conductive line on the routing layer.

22. The package substrate of claim 21, wherein the first width is less than the second width.

23. The package substrate of claim 22, wherein the second conductive line has a third width that is less than or equal to the second width.

24. The package substrate of claim 21, wherein at least one portion of the first conductive line is perpendicular to an edge of the stiffener on the first conductive line.

25. The package substrate of claim 24, wherein the at least one portion of the conductive line that is perpendicular to the edge of the stiffener comprises a transition from the first width to the second width.

26. A package substrate, comprising:
a routing layer, the routing layer comprising a dielectric layer;
a stiffener above the routing layer, the stiffener comprising an opening;
a conductive line on the routing layer, the conductive line comprising a first portion and a second portion, the first portion having a first width, the second portion having a second width, the conductive line extending from a first region of the routing layer to a second region of the routing layer, the first region being under the stiffener, the second region being outside the stiffener, the first portion being on the first region, and the second portion being on the second region; and
another conductive line adjacently located on the routing layer next to the conductive line, wherein a pitch between the two adjacent conductive lines is a function of a difference between the first width and the second width.

27. A package substrate, comprising:
a routing layer, the routing layer comprising a dielectric layer;
a stiffener above the routing layer, the stiffener comprising an opening;
a conductive line on the routing layer, the conductive line comprising a first portion and a second portion, the first portion having a first width, the second portion having a second width, the conductive line extending from a first region of the routing layer to a second region of the routing layer, the first region being under the stiffener, the second region being outside the stiffener, the first portion being on the first region, and the second portion being on the second region; and
another conductive line adjacently located on the routing layer next to the conductive line, wherein a pitch between the two adjacent conductive lines is a selected from a range of values comprising 18-80 micrometers ($\mu$m).

28. A package substrate, comprising:
a routing layer, the routing layer comprising a dielectric layer;
a stiffener above the routing layer, the stiffener comprising an opening; and
a conductive line on the routing layer, the conductive line comprising a first portion and a second portion, the first portion having a first width, the second portion having a second width, the conductive line extending from a first region of the routing layer to a second region of the routing layer, the first region being under the stiffener, the second region being outside the stiffener, the first portion being on the first region, and the second portion being on the second region, wherein a length of the stiffener is less than, approximately equal to, or equal to 8000 $\mu$m.

29. A package substrate, comprising:
a routing layer, the routing layer comprising a dielectric layer;
a stiffener above the routing layer, the stiffener comprising an opening; and
a conductive line on the routing layer, the conductive line comprising a first portion and a second portion, the first portion having a first width, the second portion having a second width, the conductive line extending from a first region of the routing layer to a second region of the routing layer, the first region being under the stiffener, the second region being outside the stiffener, the first portion being on the first region, and the second portion being on the second region, wherein a clearing area on the routing layer between an electrical ground and an edge of the stiffener is less than, approximately equal to, or equal to 310 $\mu$m.

* * * * *